(12) United States Patent
Ouellet et al.

(10) Patent No.: US 7,459,329 B2
(45) Date of Patent: *Dec. 2, 2008

(54) METHOD OF FABRICATING SILICON-BASED MEMS DEVICES

(75) Inventors: Luc Ouellet, Granby (CA); Robert Antaki, St-Luc (CA)

(73) Assignee: DALSA Semiconductor Inc., Waterloo, ON (CA)

(*) Notice: Subject to any disclaimer, the term of this patent is extended or adjusted under 35 U.S.C. 154(b) by 305 days.

This patent is subject to a terminal disclaimer.

(21) Appl. No.: 11/254,774

(22) Filed: Oct. 21, 2005

(65) Prior Publication Data

US 2006/0110895 A1 May 25, 2006

Related U.S. Application Data

(62) Division of application No. 10/459,619, filed on Jun. 12, 2003, now Pat. No. 7,144,750.

(51) Int. Cl.
*H01L 21/00* (2006.01)

(52) U.S. Cl. ............... 438/50; 438/52; 438/53

(58) Field of Classification Search .......... 438/50, 438/52, 53, 510, 48
See application file for complete search history.

(56) References Cited

U.S. PATENT DOCUMENTS 5,672,449 A 9/1997 Loschner et al.

5,922,212 A 7/1999 Kano et al.
7,144,750 B2 * 12/2006 Ouellet et al. ............ 438/50

OTHER PUBLICATIONS

Orpanam et al "Control of residual stress of polysilicon thin films by heavy dopinbg in surface micromachining" Transducers, San Francisco, Jun. 24-27, 1991.
Scheiter T et al "Rapid Thermal Annealing of Doped Silicon Films to Relax Intrinisic Stress" vol. 8. No. 7. 1996. pp. 445-454.
Furtsch M. et al "influence of Anneals in Oxygen Ambient on Stress of Thick Polvsilicon Lavers". vol. 76. No. 1-3. Aug. 30, 1999 pp. 335-342.
Gennissen P T J et al "Bipolar-compatible Epitaxial Poly for Smart Sensors—Stress Minimization and applications" vol. 62, No. 1-3 Jul. 1997 pp. 636-645.
Alley R L et al "The Effect of Release-etch processing on surface Microstructure Stiction" Solid State Sensor and Actuator Workshop, 1992—pp. 202-207.

* cited by examiner

*Primary Examiner*—W. David Coleman
*Assistant Examiner*—Su C Kim
(74) *Attorney, Agent, or Firm*—Marks & Clerk; Richard J. Mitchell

(57) ABSTRACT

A method of fabricating a silicon-based microstructure is disclosed, which involves depositing electrically conductive amorphous silicon doped with first and second dopants to produce a structure having a residual mechanical stress of less than +/=100 Mpa. The dopants can either be deposited in successive layers to produce a laminated structure with a residual mechanical stress of less than +/=100Mpa or simultaneously to produce a laminated structure having a mechanical stress of less than +/=100Mpa.

16 Claims, 25 Drawing Sheets

The low surface roughness, low stress and low stress gradient laminated combination of compressive mechanical stress arsenic-doped, antimony-doped or bismuth-doped electrically conductive amorphous silicon with the tensile mechanical stress phosphorus-doped electrically conductive amorphous silicon (shown here is the arsenic-doped and phosphorus-doped laminated amorphous silicon)

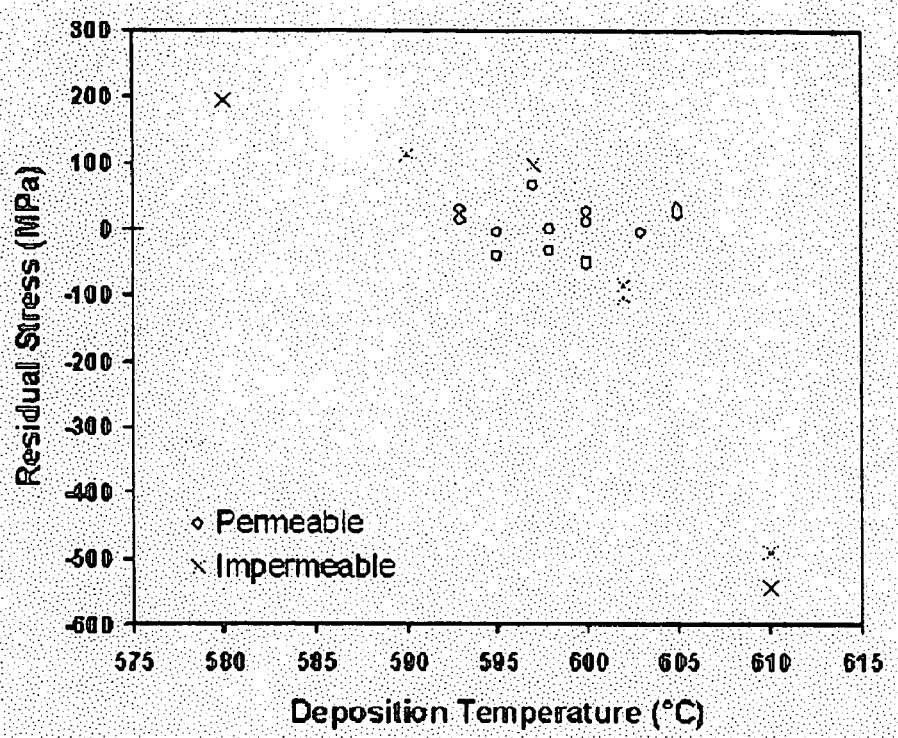
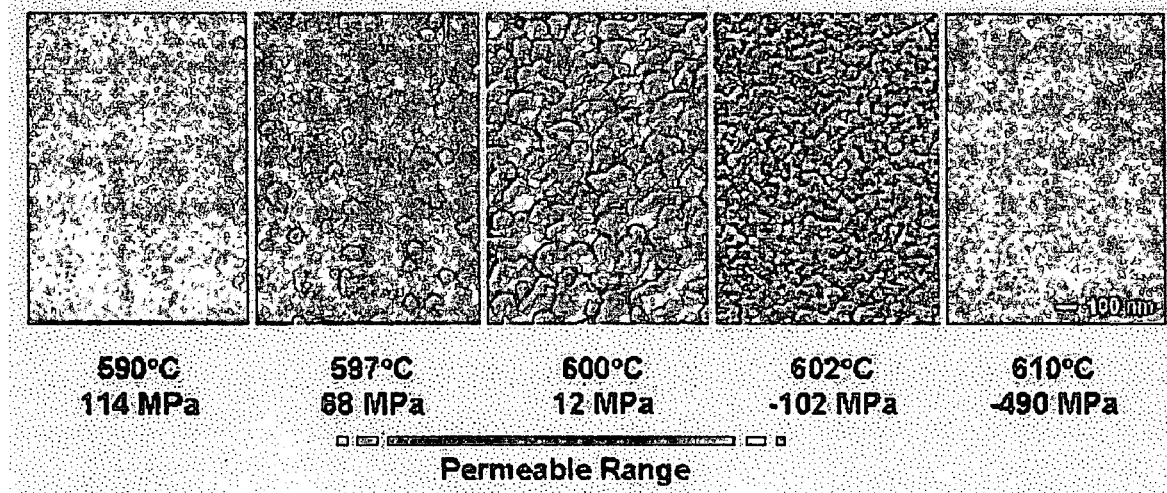
FIG. 7
PRIOR ART

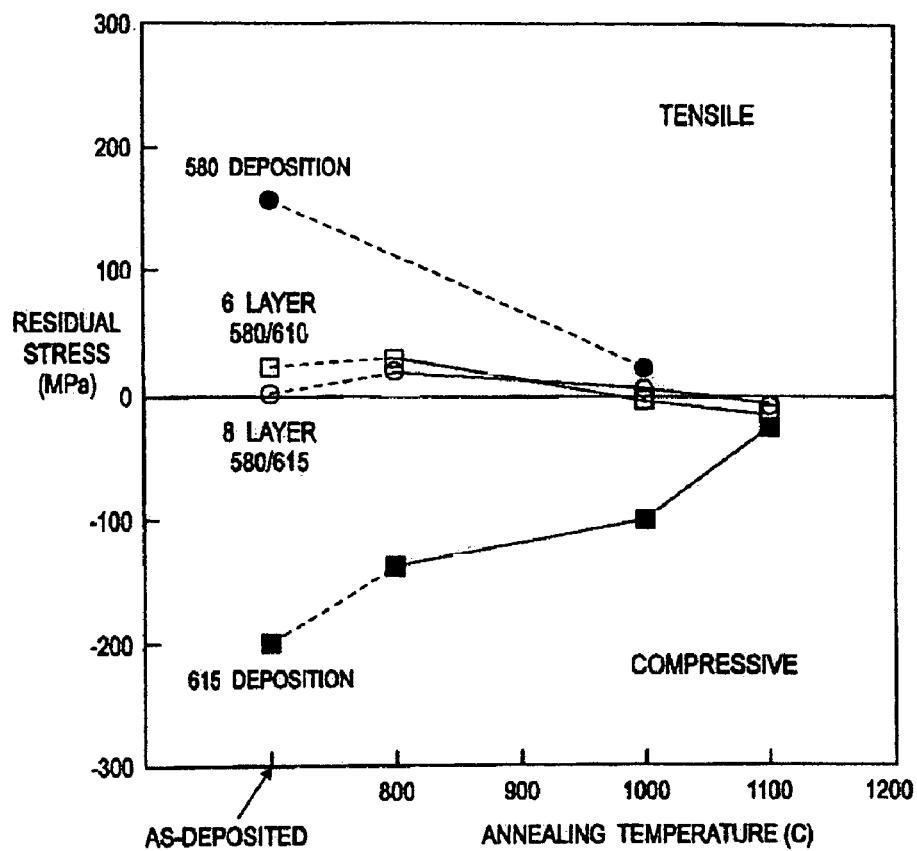
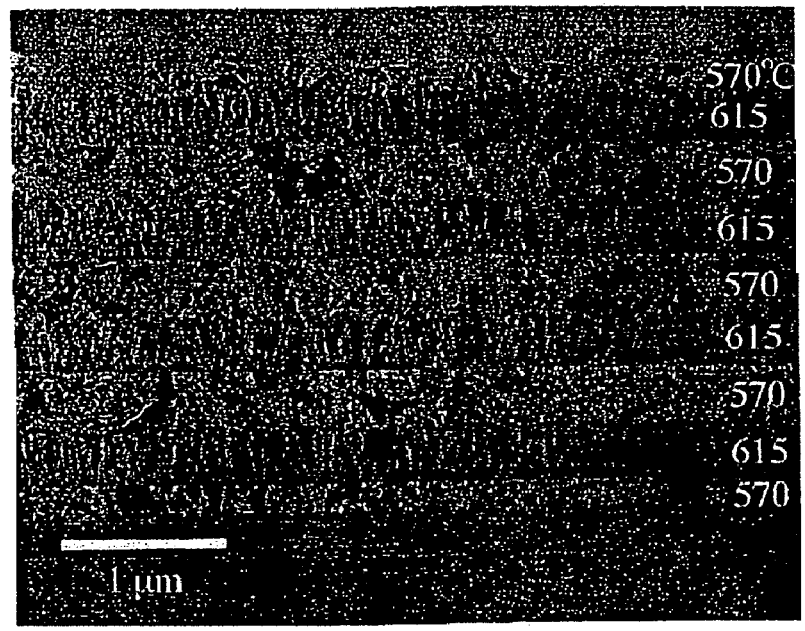
Nine layers laminated structure
FIG.9
PRIOR ART

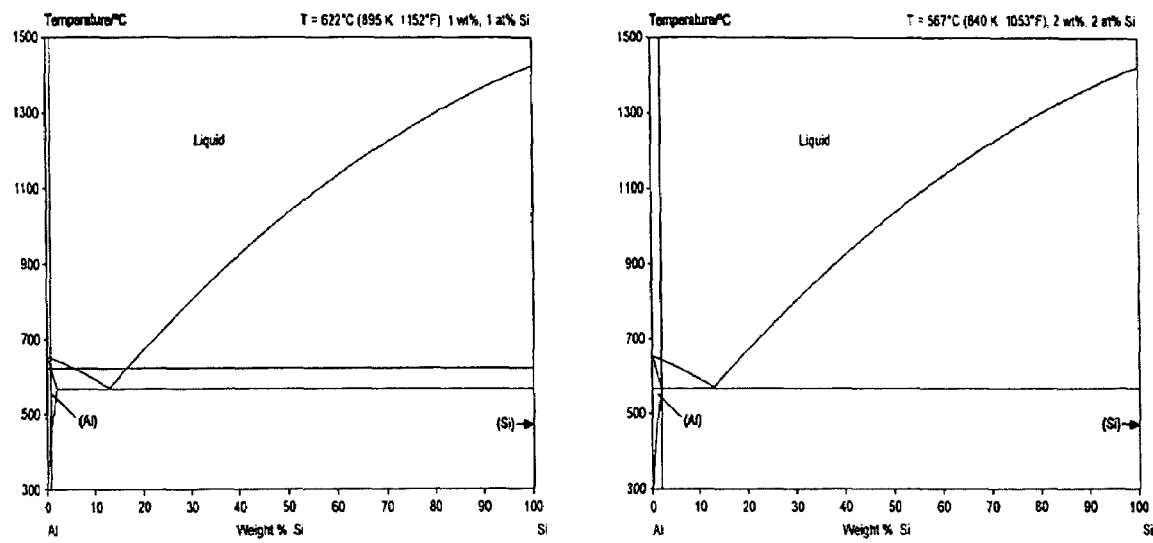
Al-Si phase diagram
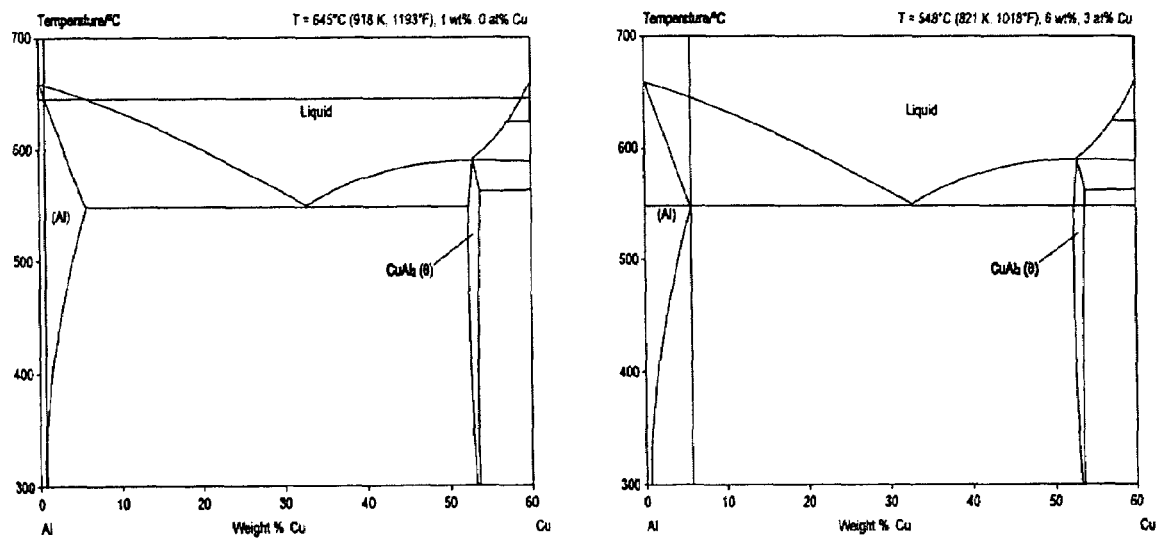
Al-Cu phase diagram
FIG. 12
PRIOR ART

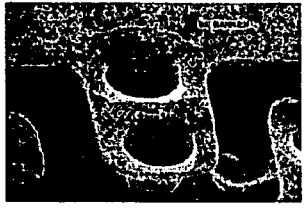
TiN barrier under 1st metal
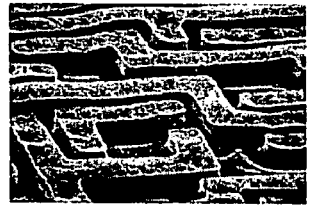
Reflowed 1st metal
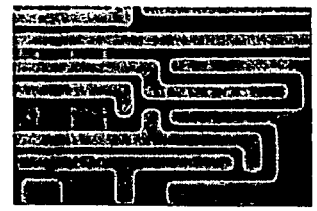
Reflowed 1st metal (Top)
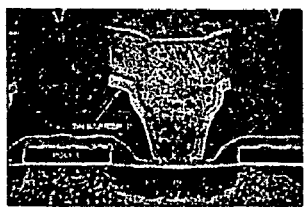
Reflowed 1st metal on P+
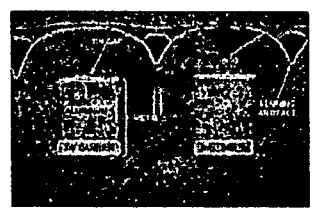
Reflowed 1st metal TiN cap
Reflowed 1st metal on N+
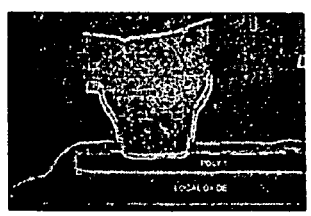
Reflowed 1st metal on Poly 1
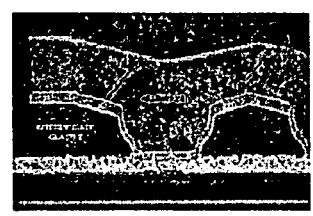
Reflowed 1st metal on Polycid
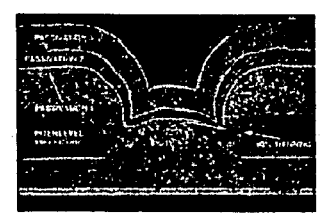
2nd metal contact to 1st metal
Non-reflowed 2nd metal
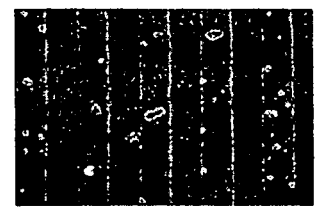
Silicon nodules in 2nd metal
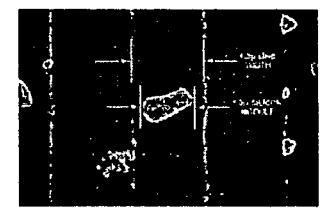
Silicon nodules in 2nd metal
FIG. 13
PRIOR ART

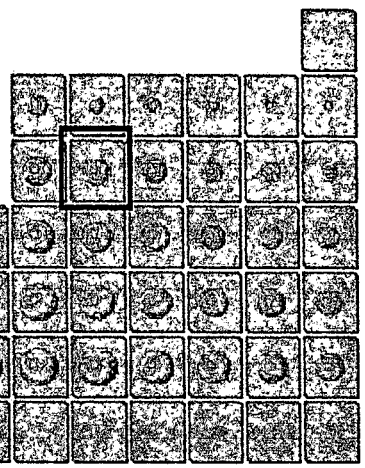
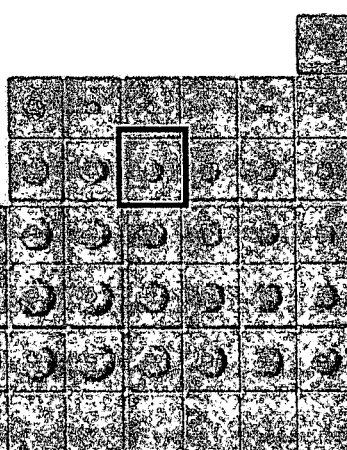
FIG. 17
PRIOR ART

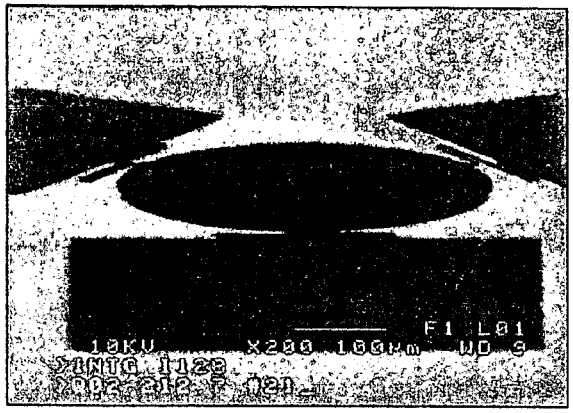
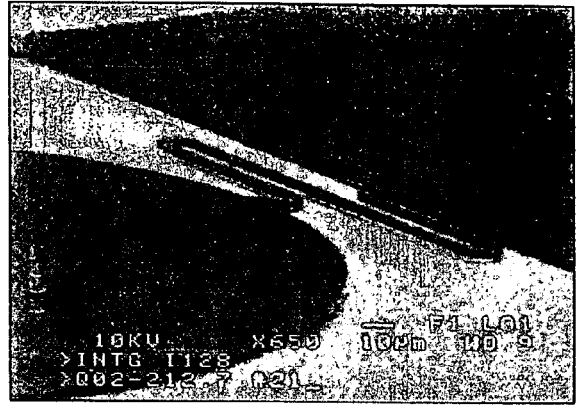
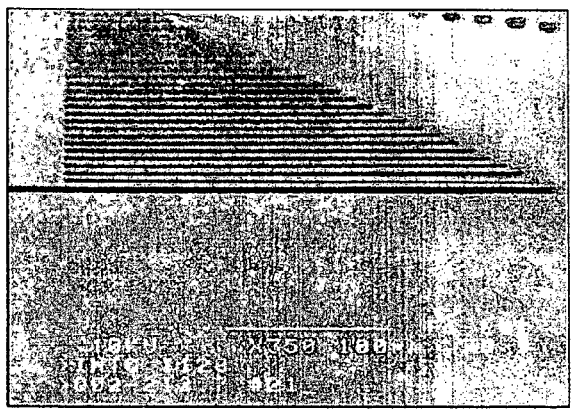
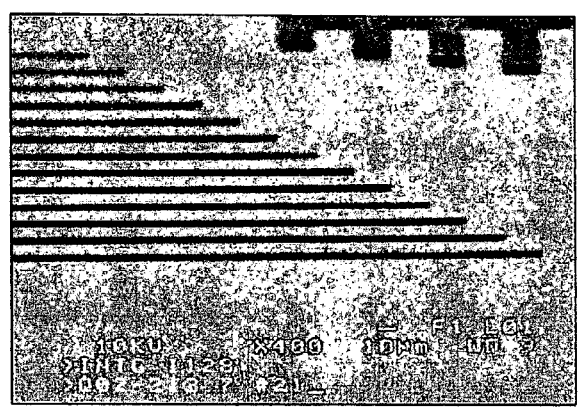
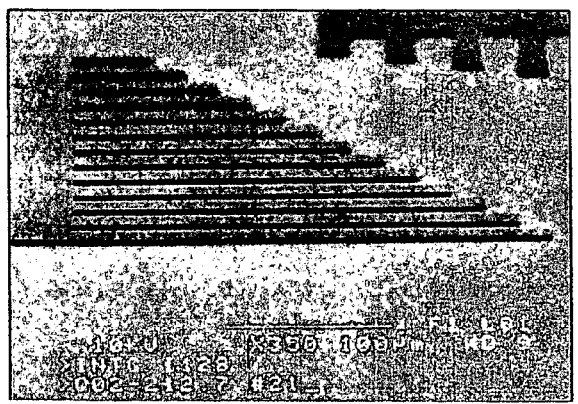
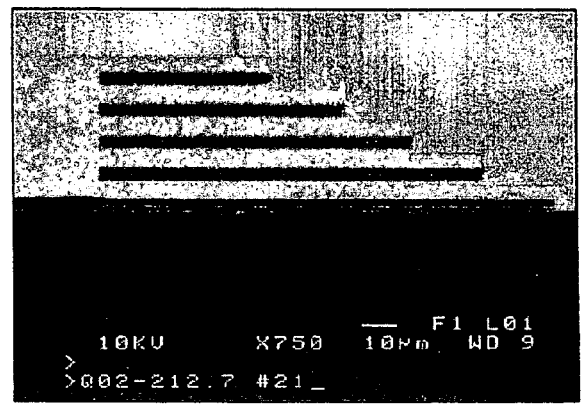
FIG.20
PRIOR ART

Figure 25
Arsenic atomic radius is same as silicon's
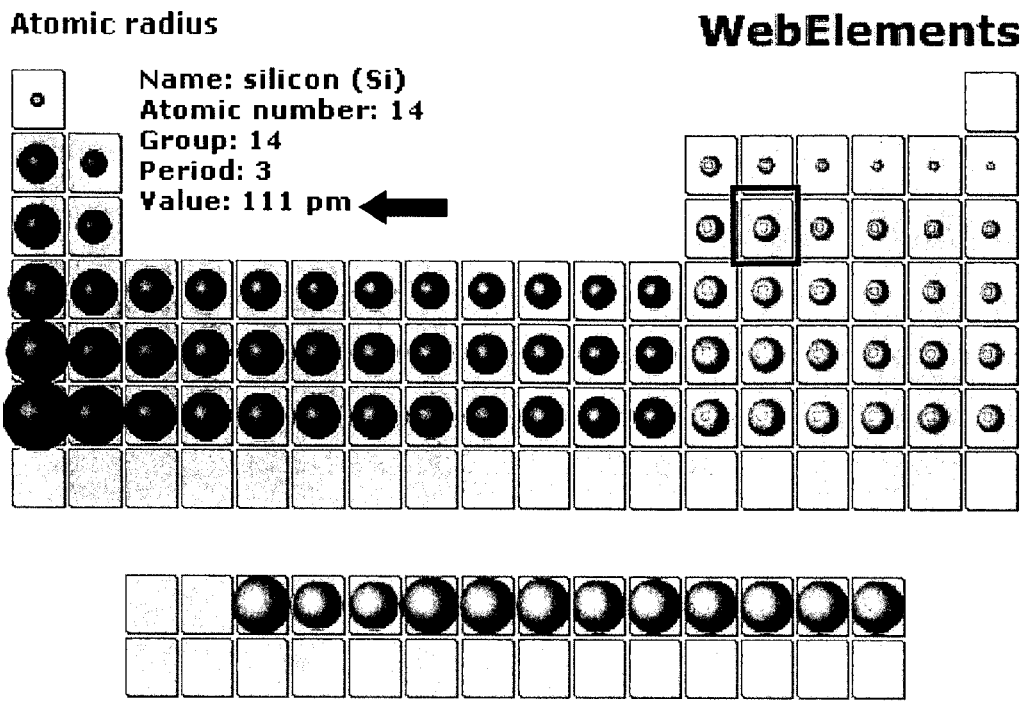
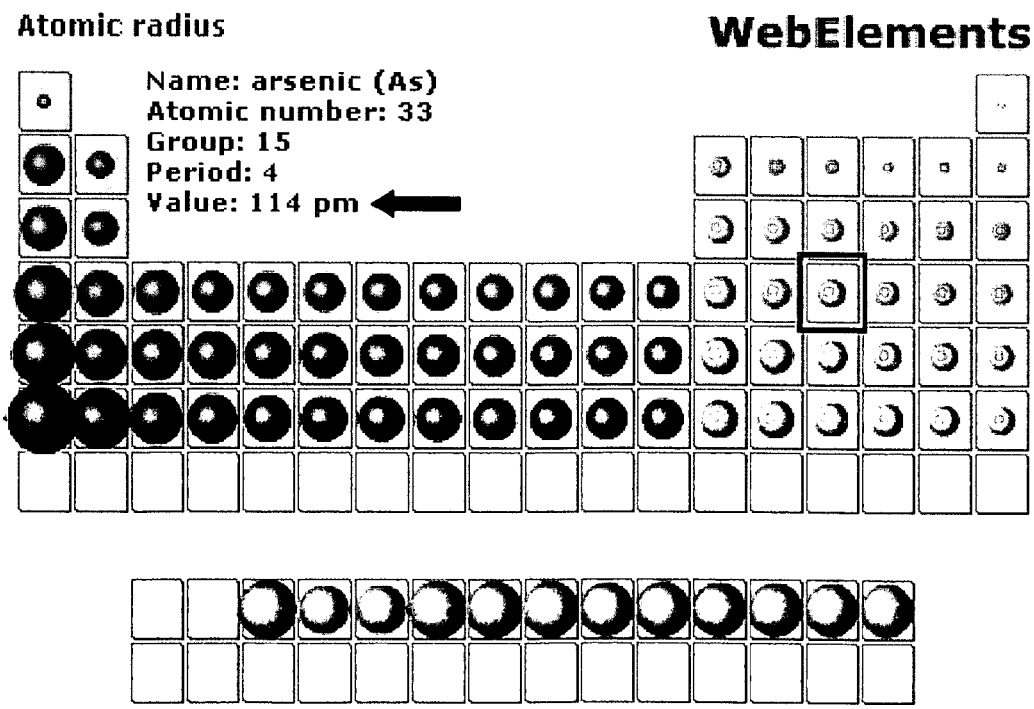

Figure 26
The low surface roughness, low stress and low stress gradient laminated combination of compressive mechanical stress arsenic-doped, antimony-doped or bismuth-doped electrically conductive amorphous silicon with the tensile mechanical stress phosphorus-doped electrically conductive amorphous silicon (shown here is the arsenic-doped and phosphorus-doped laminated amorphous silicon)

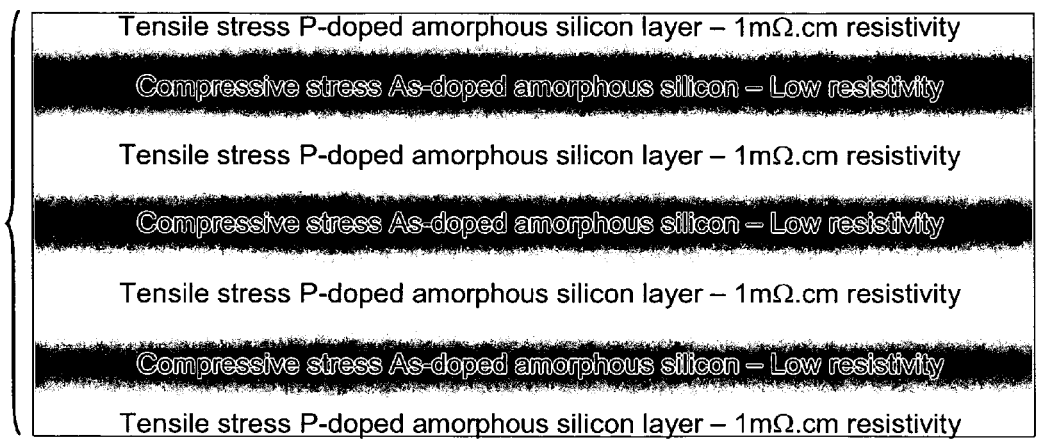

Figure 27
The low surface roughness, low stress and low stress gradient arsenic-doped and phosphorus-doped homogeneous amorphous silicon or alternately of antimony-doped and phosphorus-doped homogeneous amorphous silicon or alternately bismuth-doped and phosphorus-doped homogeneous amorphous silicon (shown here is the arsenic-doped and phosphorus-doped homogeneous amorphous silicon)

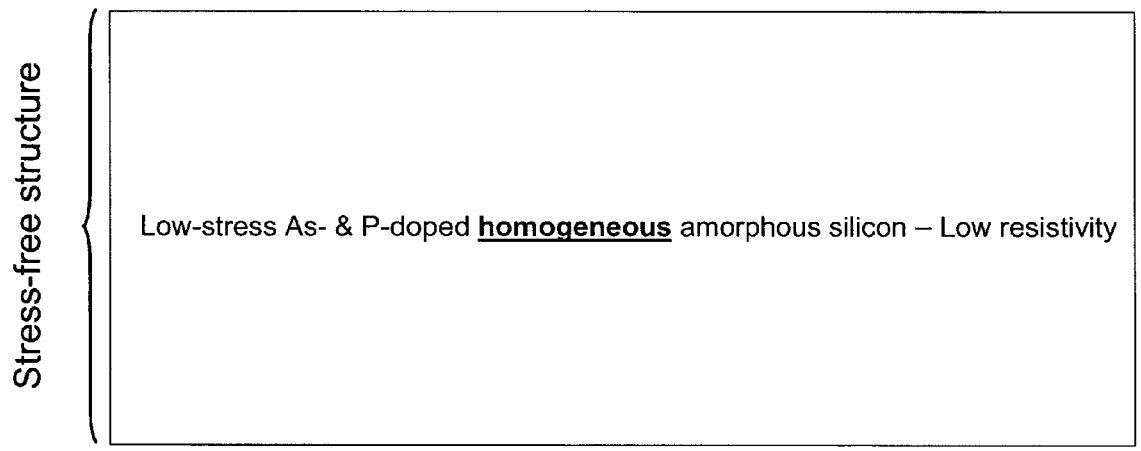

Bond enthalpy of the homodinuclear molecules (kJ/mol)

Figure 29
Standard Gibbs energy of formation (kJ/mol) of hydrogen compounds at 25°C

| Period | Group 1 / I | 2 / II | 13 / III | 14 / IV | 15 / V | 16 / VI | 17 / VII |
|---|---|---|---|---|---|---|---|
| 2 | LiH(s) −68.4 | BeH$_2$(s) (+20) | B$_2$H$_6$(g) +86.7 | CH$_4$(g) −50.7 | NH$_3$(g) −16.5 | H$_2$O(l) −237.1 | HF(g) −273.2 |
| 3 | NaH(s) −33.5 | MgH$_2$(s) −35.9 | AlH$_3$(s) (−1) | SiH$_4$(g) +56.9 | PH$_3$(g) +13.4 | H$_2$S(g) −33.6 | HCl(g) −95.3 |
| 4 | KH(s) (−36) | CaH$_2$(s) −147.2 | GaH$_3$ >0 | GeH$_4$(g) +113.4 | AsH$_3$(g) +68.9 | H$_2$Se(g) +15.9 | HBr(g) −53.5 |
| 5 | RbH(s) (−30) | SrH$_2$(s) (−141) | | SnH$_4$(g) +188.3 | SbH$_3$(g) +147.8 | H$_2$Te(g) >0 | HI(g) +1.7 |
| 6 | CsH(s) (−32) | BaH$_2$(s) (−140) | | | | | |

Data from *J. Phys. Chem. Ref. Data*, 11, Supplement 2 (1982). Values in parenthesis are based on $\Delta H_f^\ominus$ data from this source and entropy contributions estimated by the method of W. M. Latimer, p. 359 of *Oxidation potentials*. Prentice Hall, Englewood Cliffs, NJ (1952).

Vapor pressure of the elements

Solubility limit of arsenic in silicon as function of temperature

METHOD OF FABRICATING SILICON-BASED MEMS DEVICES

CROSS REFERENCE TO RELATED APPLICATION

This application is a divisional of U.S. application Ser. No. 10/459,619 filed Jun. 12, 2003.

FIELD OF THE INVENTION

This invention relates to the field of micro-manufacturing, and in particular to a method fabricating silicon-based microelectro-mechanical systems, known as MEMS.

BACKGROUND OF THE INVENTION

The production of advanced MEMS devices requires the integration of moving mechanical parts; controlling, sensing or interfacing circuits; and, sometimes, high-voltage circuits capable of powerful actuation of these mechanical parts. The processes used to produce advanced MEMS from silicon-based structural materials typically require a high-temperature stress-relief step to reduce the mechanical stress of silicon-based structural material and allow its proper machining and mechanical release of the moving parts. This high-temperature stress-relief step imposes a requirement that the integrated circuit be fabricated after the high surface topology mechanical parts. This is an undesirable combination since advanced integrated circuits require very fine lithography to be performed using short depth-of-focus equipment. The high surface topology imposed by the mechanical parts then has to be eliminated by suitable chemical-mechanical polishing (CMP) or other means. The high-temperature stress-relief restriction, the extra cost associated with CMP planarization, and the need to fabricate the integrated circuit after the mechanical parts are significant drawbacks associated with the prior art.

Examples of Restrictive High-Temperature Stress-Relief Processes of Polysilicon at Temperatures Exceeding 1000° C.:

A first well known example of such a restrictive high-temperature stress-relief process is Analog Devices' Modular-MEMS process involving the integration of a 6 μm thick moving polysilicon structural material and a 5V 0.8 μm CMOS process for the control, sensing and interfacing functions. An example of this process is shown in the following reference: Moorthi Palaniapan, Roger T. Howe, John Yasaitis, "Integrated Surface-Micromachined Z-axis Frame Microgyroscope", International Electron Device Meeting 2002, San Francisco, Dec. 8-11, 2002, Session 8: Detectors, sensors and displays—Recent advances in inertial and biological MEMs. This reference shows that Analog Devices' Modular MEMS process uses a high-temperature stress-relief of a 6 μm thick moving polysilicon structural layer forming the mechanical parts. Following this high-temperature stress-relief a thick selective epitaxial silicon layer is epitaxially grown and used as substrate for the integrated circuit fabricated after a chemical-mechanical polishing, CMP, is performed as to achieve a smooth surface. The epitaxial silicon deposition is typically performed at a temperature of about 1000-1200° C. and then result in another stress relief of the structural polysilicon. The fabrication of the integrated circuit in this grown and polished epitaxial silicon will result in advanced MEMS such as Analog Devices' accelerometers and micro-gyroscopes.

In summary Analog Devices' Modular MEMS process shown at FIG. 1 is then characterized by the following:

It requires the integrated circuit to be fabricated after the high surface topology mechanical parts. Since advanced integrated circuits involve very fine structures to be fabricated into a smooth substrate using short depth-of-focus photo equipment, a planar substrate with smooth surface finish is to be achieved following the micromachining of these mechanical parts;

It requires a high-temperature stress-relief of the structural polysilicon which is also performed after the MEMS fabrication, during the epitaxial growth of the substrate to be used for the integrated circuit portion;

It requires a CMP after the epitaxial growth as to achieve the required planarity and surface finish;

It requires the integrated circuit to be fabricated after the CMP into the polished epitaxial silicon regions.

Analog Devices' Modular MEMS process imposes the use of a high-temperature stress-relief of the MEMS structures during the epitaxial growth of the substrate to be used for the integrated circuit portion, imposes the use of CMP and imposes the fabrication of the integrated circuit AFTER the mechanical parts.

A second example of such a restrictive high-temperature stress-relief process is Samsung Advanced Institute of Technology's (SAIT's) MEMS process involving the integration of a double polysilicon MEMS device with a standard integrated circuit. An example of this process is shown in the following reference: Y B Gianchandani, H Kim, M Shinn, B Ha, B Lee, K Najafi and C Song, "A fabrication process for integrating polysilicon microstructures with post-processed CMOS circuits", J. Micromech. Microeng. 10 (2000) 380-386. This reference shows that SAIT's MEMS process uses a trench created using KOH to recess the microstructural polysilicon of the mechanical parts protected by an oxide/nitride cap layer during the fabrication of the integrated circuit after the fabrication of the mechanical parts. The 1200° C. and 16 hours drive-in diffusion of the p-well implant is used as stress-relief of the microstructural polysilicon as to achieve an advanced MEMS.

SAIT's MEMS process shown at FIG. 2 is then characterized by the following:

It also requires the integrated circuit to be fabricated after the high surface topology mechanical parts. This integrated circuit is fabricated at least 100 μm away from the recessed region where the mechanical parts are located. All layers constituting the integrated circuit are removed from the recessed region using the protective oxide/nitride cap layer as etch-stop and protection of the mechanical parts. Keeping the integrated circuit in the planar region of the silicon wafer and away from the recessed region eliminates the depth-of-focus problem;

It also requires a high-temperature stress-relief of the structural polysilicon. This is performed at 1200° C. for 16 hours during the drive-in diffusion of the p-well implant after the MEMS fabrication;

It does not require a CMP to achieve the required planarity and surface finish because the integrated circuit is fabricated at least 100 μm away from the recessed region where the mechanical parts are located and because the interconnections between the integrated circuit and mechanical parts are performed over the sloped region achieved by the KOH etch;

It requires the integrated circuit to be fabricated after the mechanical parts, into the horizontal regions, away from the recessed region where the mechanical parts are located.

SAIT's MEMS process also imposes the use of a high-temperature stress-relief of the MEMS structures at 1200° C. for 16 hours during the drive-in diffusion of the p-well implant of the integrated circuit and imposes the fabrication of the integrated circuit after the mechanical parts.

A third example of such a restrictive high-temperature stress-relief process is Sandia National Laboratories' (Sandia's) Integrated MicroElectroMechanical Systems (IMEMS) process involving the integration of a MEMS device incorporating at least two levels of polysilicon with an integrated circuit. An example of this process is shown in the following reference: J. H. Smith, S. Montague, J. J. Sniegowski, J. R. Murray, and P. J. McWhorter, "Embedded micromechanical devices for the monolithic integration of MEMS with CMOS", IEDM 1995 proceedings, pp. 609-612. This reference shows that Sandia's MEMS process uses a trench created using KOH to recess the mechanical parts in a shallow trench, requires polishing the wafer using CMP, and requires sealing the mechanical parts in the trench using a silicon nitride layer. A high-temperature stress-relief is performed after the mechanical parts are embedded in the trench prior to processing conventional CMOS, bipolar or BiCMOS processes. This high-temperature stress-relief of the micro-structural polysilicon ensures that the subsequent thermal budget of the CMOS, bipolar or BiCMOS processing will not affect the mechanical properties of the polysilicon and will achieve an operational IMEMS.

Sandia's IMEMS process shown at FIG. 3 is then characterized by the following:

It requires the CMOS bipolar or BiCMOS devices to be fabricated AFTER the high surface topology mechanical parts. Again, since advanced integrated circuits involve very fine structures to be fabricated into a smooth substrate using short depth-of-focus photo equipment, a planar substrate with smooth surface finish is to be achieved following the micro-machining of these mechanical parts;

It requires a high-temperature stress-relief of the structural polysilicon. This is performed after the MEMS fabrication and prior the CMOS bipolar or BiCMOS processing;

It requires a CMP to be performed after the MEMS fabrication and prior the CMOS bipolar or BiCMOS processing;

It requires the CMOS bipolar or BiCMOS to be performed after the CMP into the polished silicon regions.

The Sandia's IMEMS process also imposes the use of a high-temperature stress-relief of the MEMS structures prior the integrated circuit processing, imposes the use of CMP and imposes the fabrication of the integrated circuit after the mechanical parts.

A fourth example of such a restrictive process is MEMSCAP's Polysilicon Multi-User MEMS process, MUMP, of the following reference: David A. Koester, Allen Cowen, Ramaswamy Mahadevan and Busbee Hardy, "PolyMUMPs design handbook, revision 8.0", 2002.

This surface micromachining process uses three high-temperature stress-relief stages of phosphorus-doped polysilicon:

A high-temperature stress-relief of a 0.5 µm thick Poly 0 while diffusing the phosphorus atoms of a 2.0 µm thick phosphosilicate layer at 1050° C. for 1 hour in argon;

A high-temperature stress-relief of a 2.0 µm thick Poly 1 while diffusing the phosphorus atoms of a 0.2 µm thick phosphosilicate layer at 1050° C. for 1 hour in argon;

A high-temperature stress-relief of a 1.5 µm thick Poly 2 while diffusing the phosphorus atoms of a 0.2 µm thick phosphosilicate layer at 1050° C. for 1 hour in argon.

MEMSCAP's MUMPs process shown in FIG. 4 is then characterized by the following:

It requires three 1050° C. 1 hour each high-temperature stress-relief steps to dope and stress-relieve the three layers of polysilicon;

Because of these three successive 1050° C. 1 hour each dopant diffusions and stress-relief relieves, any attempt to include an integrated circuit in the MUMPs process would require the integrated circuit to be fabricated after the MUMPs to prevent the destruction of the junctions during such restrictive stress-relieves.

A fifth example of such a restrictive high-temperature stress-relief process is Robert Bosch GmbH's surface micromachining process described in the following three references: Horst Münzel, Michael Offenberg, Klaus Heyers, Bernhard Elsner, Markus Lutz, Helmut Skapa, Heinz-Georg Vossenberg, Nicholas Buchan, Eckhard Graf, U.S. Pat. No. 5,937,275, "Method for producing acceleration sensors", Robert Bosch GmbH, filed on Jul. 9, 1996 and granted on Aug. 10, 1999; M. Furtsch, M. Offenberg, H. Muenzel, J. R. Morante, 'Comprehensive study of processing parameters influencing the stress and stress gradient of thick polysilicon layers', SPIE Conference Proceedings 'Micromachining and microfabrication process technology III, conference proceedings', SPIE Vol. 3223, pp. 130-141, Austin Tex., Sep. 29-30, 1997; and http://www.europractice.bosch.com/en/download/customer_support.pdf This process uses two levels of polysilicon:

A first 0.45 µm thick surface polysilicon layer deposited at 630° C. by Low Pressure Chemical Vapor Deposition (LPCVD), implanted with antimony and annealed at 1000° C. in an oxygen ambient as to drive and activate the Sb dopant;

A second 10.3 µm thick structural epipoly layer is deposited as a 11.8 µm thick layer at a rate of 3.5 µm/minute and at a temperature of 1180° C. in a ASM Epsilon One Model-E2 single wafer epitaxy reactor using a trichlorosilane (SiHCl3), hydrogen (H2), and phosphine (PH3) process. The resulting 11.8 µm thick structural epipoly layer has a very rough surface (Ra of 260 nm) unacceptable for further processing and thus requiring the use of CMP to reduce the thickness of the structural epipoly layer to 10.3 µm and its surface roughness to about 5 nm.

Robert Bosch GmbH's surface micromachining process shown in FIG. 5 is then characterized by the following:

It experiences two high-temperature stress-relieves: A first, at 1000° C. in an oxygen ambient, to drive and activate the Sb dopant; and a second, at 1180° C., for the deposition of the structural epipoly layer;

Because of these two successive high-temperature stress-relieves, any tentative of integrating an integrated circuit to Robert Bosch GmbH's surface micromachining process would also require the integrated circuit to be fabricated AFTER the MEMS process as to prevent the destruction of the junctions during such restrictive heat treatments.

A sixth example of such a restrictive high-temperature stress-relief process is reported by Sandia's CMOS-first, micromechanics-last MEMS process involving the integration of a MEMS device with an integrated circuit where conventional aluminum interconnects are completely replaced by tungsten interconnects to prevent melting the aluminum interconnects and allow the integrated circuit to withstand the 1100° C., 3 hours heat treatment required for the stress-relief of the micro-machined polysilicon. An example of this all-tungsten process is shown in the following three references: Stephen Montague, James H. Smith, Jeffrey. J. Sniegowski, Paul J. McWhorter, U.S. Pat. No. 5,798,283, "Method for integrating microelectromechanical devices with electronic circuitry", Sandia National laboratories, filed on Sep. 6, 1995 and granted on Aug. 25, 1998; Carole C. Barron, James G. Flemming, Stephen Montague, U.S. Pat. No. 5,963,788, "Method for integrating microelectromechanical devices with electronic circuitry", Sandia National laboratories, filed on Nov. 19, 1997 as continuation in-part of application Ser. No. 08/524,700 (U.S. Pat. No. 5,798,283) and granted on Oct. 5, 1999; James H. Smith, Stephen Montague, and Jeffrey. J. Sniegowski, "Material and processing issues for the monolithic integration of microelectronics with surface-micromachined polysilicon sensors and actuators", Micromachining and Microfabrication '95, SPIE, Oct. 95.

These references show that Sandia's CMOS-first, micromechanics-last MEMS process of FIG. 6 fabricates the integrated circuit before the mechanical parts, thus reducing the surface topology and preventing the need for CMP. This is a major improvement over the upper-cited Prior Art references but, following the integrated circuit fabrication, this process still requires a very restrictive 3 hours duration and 1100° C. stress-relief of the structural polysilicon. To enhance the thermal stability of the integrated circuit, aluminum interconnects are completely replaced by 1.0 µm thick low-stress tungsten interconnects deposited by chemical vapour deposition, CVD. In order to separate the tungsten from the underlying silicon at the contacts an adhesion layer/diffusion barrier stack of 15 nm of selective titanium silicide, TiSi, followed 50 nm of titanium nitride, TiN, is used. Where tungsten metallization is deposited over the field oxide, only the TiN layer is used. Since it is difficult to bond aluminum or gold bond wires to tungsten, bond pads are formed by using the structural polysilicon deposited on top of a 50 nm TiN diffusion barrier and the 1 micron of tungsten. The process is unstable because:

- The compressive stress and surface roughness of the tungsten films cause processing difficulties, such as delamination, or lifting, of the bondpads and photolithographically instabilities with projection steppers. A manually-aligned contact aligner has to be used;
- The TiN diffusion barrier sometimes fail during the 3 hours, 1100° C. stress-relief of the structural polysilicon, thus forming porous WTiSi and WSi at the basis of the contacts;
- The out-diffusion of boron from the p+ source/drain implants in silicon is causing a severe performance degradation of the p-channel devices due to an increase in contact resistance between tungsten and p-type silicon during the 3 hours, 1100° C. stress-relief of the structural polysilicon;
- Because of the problems encountered in attempting to bring this technology to a manufacturing facility, Sandia decided to try other approaches besides the all-tungsten, CMOS-first, micromechanics-last MEMS process involving the required 3 hours duration and 1100° C. stress-relief of the structural polysilicon.

At this point, it will be apparent that the restrictive high-temperature stress-relief of the various upper-described popular MEMS processes prevents the integration of the integrated circuit before the micro-machining steps and prevents any type of modular integration of these micro-machining steps over the integrated circuit.

Any integration scenarios of these micro-machining steps over an integrated circuit require the stress-relief of structural silicon-based layers at a much lower temperature then 1000° C.

Techniques Used to Reduce the Stress-Relief Temperature of Deposited Silicon Films A first example of a technique used to reduce the stress-relief temperature of un-doped silicon films is provided by the following publications from University of Michigan: Khalil Najafi and Carlos. H. Mastrangelo, "Solid-state microsensors and smart structures", 1993 IEEE Ultrasonics Symposium, pp. 341-350; Carlos. H. Mastrangelo and William C. Tang, "Surface-micromachined capacitive differential pressure sensor with lithographically defined silicon diaphragm", Journal of microelectromechanical systems, Vol. 5, No. 2, June 1996; P.-C. Hsu, C. H. Mastrangelo, and K. D. Wise, "A high sensitivity polysilicon diaphragm condenser microphone", 1998 MEMS Conference, Heidelberg, Germany, Jan. 25-29, 1998; B. P. Gogoi and C. H. Mastrangelo, "Force Balanced Micromachined Pressure Sensors", IEEE Transactions on electron devices, IEEE Trans. Electron Dev., December 1999; B. P. Gogoi and C. H. Mastrangelo, "A low voltage force balanced pressure sensor with hermetically sealed servomechanism", IEEE MEMS'99 Conference, pp. 493-498, Orlando, Fla., January 1999; Kun Wang and Clark T.-C. Nguyen, "High-Order Medium Frequency Micromechanical Electronic Filters", Journal of microelectromechanical systems, Vol. 8, No. 4, December 1999; Robert D. White, Karl Grosh, "Design and characterization of a MEMS piezoresistive cochlear-like acoustic sensor", Proceedings of IMECE'02, 2002 ASME International Mechanical Engineering Congress and Exposition, New Orleans, La., Nov. 17-22, 2002.

This technique describes the deposition of a low-stress un-doped polysilicon at a pressure of 160 mTorr and at a temperature of about 590-610° C. This un-doped polysilicon is electrically non-conductive and a phosphorus implantation at an energy of 100 keV and a dose of about $1-2E16/cm^2$ followed by an anneal at 950° C. for a few hours in nitrogen is required as to activate the phosphorus dopants and increase its electrical conductivity. This high-temperature stress-relief allow the mechanical stress of the electrically conductive polysilicon to be reduced to about 25 MPa but again limits the integration over an integrated circuit.

Alternatively, this technique describes the deposition of an un-doped polysilicon film at a temperature of 588° C. resulting in a non-conductive polysilicon having an as-deposited tensile stress of less then 100 MPa. Again, a phosphorus implantation at an energy of 50 keV and a dose of about $7E15/cm^2$, followed by a one hour duration 1050° C. phosphorus activation and stress-relief in nitrogen reduce its residual stress as much as possible.

This technique then requires a post-deposition implantation and a few hours duration 950° C. stress-relief and activation or a one hour duration 1050° C. stress-relief and actuation of the deposited polysilicon. The few hours duration 950° C. stress-relief and activation is marginally better then the one associated with the above-described Prior Art references and, again, any tentative of an integrating integrated circuit to University of Michigan's surface micromachining process would also require the integrated circuit to be fabricated after the MEMS process as to prevent the destruction of the junctions during such restrictive heat treatments.

A second example of a technique used to reduce the stress-relief temperature of silicon films is provided by the following publications from UC Berkeley: K. S. Lebouitz, A. Mazaheri, R. T. Howe, and A. P. Pisano, "Vacuum Encapsulation of Resonant Devices Using Permeable Polysilicon," Proc. 12th International IEEE Conference on Micro Electro Mechanical Systems (MEMS '99), Orlando, Fla., pp. 470-5.; Jeffrey D. Zahn, David Trebotich and Dorian Liepmann, "Microfabricated microdialysis microneedles for continuous medical monitoring", 1st Annual International IEEE-EMBS Special Topic Conference on Microtechnologies in Medicine & Biology 1, Oct. 12-14, 2000, Lyon, France; John McCaslin Heck, "Polycrystalline silicon germanium for fabrication, release and packaging of microelectromechanical systems", Ph. D. thesis, UC. Berkeley, Spring 2001; G. M. Dougherty, T. Sands, and A. Pisano, "The Materials Science of 'Permeable Polysilicon' Thin Films," Symposium B: Materials Science of Microelectromechanical Systems (MEMS) Devices IV, MRS Fall 2001 Meeting, Boston, Mass., Nov. 27th , 2001, Materials Research Society vol. 687; http://www-bsac.eecs.berkeley.edu\~gmd\perm_page.html.

These publications show that an un-doped permeable polysilicon deposited at 597° C., 125 sccm SiH4, and 555 mTorr is characterized by a low residual stress due to pore defects (5-20 nm wide) between the polysilicon grains. This permeable polysilicon can also be deposited at 605° C., 250 sccm SiH4, and 550 mTorr. FIG. 7 shows the residual stress and surface structure of the un-doped permeable polysilicon. In order to use this low-stress un-doped permeable polysilicon as structural MEMS applications, it is again necessary to dope-and-activate it at a high-temperature ranging between 950° C. and 1050° C. as to activate the dopants and achieve low-stress conductive permeable polysilicon material. This described process to achieve doped permeable polysilicon would not be better then University of Michigan's surface micromachining process and would not substantially reduce the stress-relief temperature of the deposited conductive silicon material.

A third example of a technique used to reduce the stress-relief temperature of un-doped silicon films is provided by the following publications from U. of Wisconsin: Henry Guckel and David W. Burns, U.S. Pat. No. 4,897,360, "Polysilicon thin film process", Wisconsin Alumni Research Foundation, filed on Dec. 9, 1987 and granted on Jan. 30, 1990; Henry Guckel and Jeffry Sniegowski, U.S. Pat. No. 5,090,254, "Polysilicon resonating beam transducers", Wisconsin Alumni Research Foundation, filed on Apr. 11, 1990 and granted on Feb. 25, 1992; Henry Guckel and Jeffry Sniegowski, U.S. Pat. No. 5,188,983, "Polysilicon resonating beam transducers and method of producing the same", Wisconsin Alumni Research Foundation, filed on Jan. 3, 1992 and granted on Feb. 23, 1993.

These cited prior art patents disclose a technique for forming a low-stress un-doped re-crystallized silicon-based film. This film is deposited at a temperature of about 591° C. by low pressure chemical vapour deposition, LPCVD, using a 100% pure silane ambient at a pressure of about 300 mTorr resulting in a typical deposition rate of 6.8 nm/minute. The 2.0 µm thick as-deposited un-doped film shows two phases: A first phase, located between the substrate and the film interior, characterized by an un-doped polycrystalline material with 30 nm to 300 nm grains having no measurable preferred orientation, and a second phase, located above the first polycrystalline phase and extending up to the film surface, characterized by an un-doped amorphous material with a measured surface roughness of as low as 0.8 nm rms. The mechanical stress of this two-phase as-deposited un-doped film is typically 300 MPa compressive and can be converted to predetermined tensile stress levels by a re-crystallization using a post-deposition stress-relief in nitrogen during which the un-doped amorphous phase changes to the un-doped crystalline phase. A 60 minute duration 835° C. stress-relief in nitrogen produces a single phase re-crystallized un-doped polycrystalline film having a final tensile stress of 130 MPa and no measurable increase in surface roughness. A lower stress-relief temperature results in a re-crystallized un-doped film with a tensile stress of as low as 20 MPa. These low mechanical stress re-crystallized un-doped films are yet non-conductive. Post-deposition doping of these un-doped re-crystallized films still requires diffusion and activation at a high-temperature incompatible with a potential underlying aluminum-based integrated circuit.

A fourth example of a technique used to reduce the stress-relief temperature of silicon films is provided by the following publications from Siemens Aktiengesellschaft: Markus Biebl, U.S. Pat. No. 5,753,134, "Method for producing a layer with reduced mechanical stresses", Siemens Aktiengesellschaft, filed on Nov. 23, 1994 and granted on May 19, 1998.

This patent discloses a technique to form an un-doped silicon-based laminated structure having a reduced mechanical stress. As shown in FIG. 8, this low-stress un-doped laminated structure 30 could be deposited (respectively in order, from the underlying sacrificial layer to the top surface) using a first high-temperature compressive stress un-doped polysilicon 23, a first 0.1 to 3 nm thick auxiliary $SiO_2$ layer 24 (produced, for example, by a waiting time at atmosphere), a second low-temperature tensile stress un-doped amorphous silicon 25, a second 0.1 to 3 nm thick auxiliary $SiO_2$ layer 26, a third high-temperature compressive stress un-doped polysilicon 27, a third 0.1 to 3 nm thick auxiliary $SiO_2$ layer 28 and a fourth low-temperature tensile stress amorphous un-doped silicon 29. The auxiliary $SiO_2$ layers 24, 26, 28 assure that no epitaxial growth occurs when growing the un-doped amorphous silicon over the un-doped polysilicon.

This patent requires that the un-doped layers 23, 25, 27, 29, of individual thickness ranging between 50 nm and 1 µm, be implanted and high-temperature activated using rapid thermal activation, RTA, at approximately 1000° C. after the deposition of the corresponding layers as to reduce the electrical resistance of the laminated structure 30. Following these four RTA, the second amorphous un-doped silicon layer 25 and the fourth amorphous un-doped silicon layer 29 are converted into doped polycrystalline silicon, similar to doped polysilicon layers 23 and 27. To ensure that the laminated structure 30 has a sheet resistance corresponding to a single doped polysilicon layer having the same thickness, these four implantations and four high-temperature RTA should break up the auxiliary $SiO_2$ layers 24, 26, 28.

The use of four RTA at a temperature of about 1000° C. is too restrictive and does not allow MEMS integration after the manufacture of the integrated circuit.

A fifth example of a technique used to reduce the stress-relief temperature of silicon films is provided by the following publications from Case Western Reserve University: Arthur H. Heuer, Harold Kahn and Jie Yang, U.S. Pat. No. 6,268,068, "Low stress polysilicon film and method for producing same", Case Western Reserve University, filed on Mar. 1, 1999 and granted on Jul. 31, 2001; Arthur H. Heuer, Harold Kahn and Jie Yang, U.S. Pat. No. 6,465,045, "Low stress polysilicon film and method for producing same", Case Western Reserve University, filed on Oct. 18, 2000 and granted on Oct. 15, 2002; Arthur H. Heuer, Harold Kahn, Jie Yang and Stephen M. Phillips, U.S. Pat. No. 6,479,166, "Large area polysilicon films with predetermined stress characteristics and method for producing same", Case Western Reserve University, filed on May 1, 2000 and granted on Nov. 12, 2002; Jie Yang, Harold Kahn, An-Qiang He, Stephen M.

Phillips and Arthur H. Heuer, "A new technique for producing large-area as-deposited zero-stress LPCVD polysilicon films: The multipoly process", IEEE Journal of microelectromechanical systems, Vol. 9, No. 4, December 2000, pp. 485-494.

These three cited prior art patents and this publication describe a technique similar to the afore-mentioned Siemens Aktiengesellschaft's patent resulting in the fabrication of low-stress laminated structures involving sequential combinations of low-temperature (570° C. or lower) tensile stress amorphous (or devitrified) un-doped silicon layers and of high-temperature (615° C.) compressive stress un-doped polysilicon layers. In this case, though, the $SiO_2$ auxiliary layers are not used as to prevent the interaction of upper amorphous (or devitrified) un-doped layers with underlying un-doped polysilicon layers. This cited prior-art technique integrates all layers in a single deposition run, without atmospheric exposure.

FIG. 9 shows an example of such a low-stress laminated structure combining tensile stress (about +200 MPa) un-doped amorphous silicon layers and compressive stress (about −200 MPa) un-doped polysilicon layers is a 3.0 µm thick laminated structure having an overall tensile mechanical stress of only 7 MPa using the following nine (9) layers:

1. A 59 minute deposition of a devitrified un-doped polysilicon layer at 570° C. followed by a 25 minutes heating to reach 615° C.;
2. A 54 minute deposition of a columnar un-doped polysilicon layer at 615° C. followed by a 30 minutes cooling to 570° C.;
3. A 118 minute deposition of a devitrified un-doped polysilicon layer at 570° C. followed by a 25 minutes heating to reach 615° C.;
4. A 54 minutes deposition of a columnar un-doped polysilicon layer at 615° C. followed by a 30 minutes cooling to 570° C.;
5. A 118 minute deposition of a devitrified un-doped polysilicon layer at 570° C. followed by a 25 minutes heating to reach 615° C.;
6. A 54 minute deposition of a columnar un-doped polysilicon layer at 615° C. followed by a 30 minutes cooling to 570° C.;
7. A 118 minute deposition of a devitrified un-doped polysilicon layer at 570° C. followed by a 25 minutes heating to reach 615° C.;
8. A 54 minute deposition of a columnar un-doped polysilicon layer at 615° C. followed by a 30 minutes cooling to 570° C.;
9. A 59 minute deposition of a devitrified un-doped polysilicon layer at 570° C.;

This patent indicates that the 59 minute duration deposition of the first and ninth un-doped layers (one-half the deposition time for each of un-doped layers 3, 5, and 7) provides a low residual stress and a relatively smooth outer finish.

Again, the laminated structure of this cited prior art patent has to be implanted and high-temperature activated using either RTA or furnace activation at approximately 1000° C. and for a duration sufficiently long to uniformly dope and reduce the electrical resistance of the obtained 3 µm thick laminated structure. Again, following this high-temperature dopant activation, the first, third, fifth, seventh and ninth devitrified un-doped silicon layers will be converted into doped polycrystalline silicon, similar to the second, fourth, sixth and eight doped polysilicon layers. This required RTA or furnace activation at a temperature of about 1000° C. is again too restrictive and do not allow MEMS integration after the integrated circuit.

A sixth example of a technique used to reduce the stress-relief temperature of silicon films is provided by the following publications from UC Berkeley: James M. Bustillo, Roger T. Howe and Richard S. Muller, "Surface Micromachining for Microelectromechanical Systems", Proceedings of the IEEE, Vol. 86, No. 8, August 1998; Jocelyn Tsekan Nee, "Hybrid surface-/bulk micromachining processes for scanning micro-optical components", Ph.D. thesis, UC Berkeley, Fall 2001.

A low-stress re-crystallized in-situ doped polysilicon has been investigated at UC Berkeley. By using a deposition temperature of 585-590° C., an in-situ doped low-resistivity polysilicon can be deposited at a relatively rapid rate. As shown in FIG. 10, this as-deposited low-resistivity phosphorus-doped polysilicon obtained at such 585-590° C. temperature suffers from crystallographic inhomogeneity observed as polysilicon grains near the underlying oxide interface which progressively disappear toward the upper surface. This non-homogeneous crystalline structure results in a stress gradient and requires a short duration 950° C. rapid-thermal annealing (RTA) to be performed as to achieve a low tensile stress with negligible stress gradient throughout the film thickness. Because the short duration 950° C. RTA replaces typically longer duration and higher temperature furnace anneals, this technique is slightly better then the upper-discussed techniques but still have a thermal budget which makes the MEMS AFTER the integrated circuit approach unfeasible because the interconnect materials will not resist such a high-temperature stress-relief.

Our co-pending U.S. patent application Ser. No. 10/410,158 filed Apr. 10, 2003, the contents of which are incorporated herein by reference, describes a strategy that permits the fabrication of advanced MEMS after the integrated circuit. This strategy, which is shown in FIG. 11, requires the mechanical parts of MEMS to be fabricated over the interconnections of the integrated circuit, thus imposing an upper limit to the process temperature of about 550° C., the maximum temperature at which aluminum interconnections can be exposed. The maximum temperature at which typical Al—Si binary alloy, Al—Cu binary alloy or Al—Si—Cu ternary alloy interconnections can be exposed is largely dependant upon the eutectic temperature of these aluminum alloys. The aluminum-rich side of the Al—Si and Al—Cu phase diagram are shown on FIG. 12. The aluminum-rich side of the Al—Si—Cu phase diagram is built from the aluminum-rich side of the individual Al—Si, Al—Cu phase diagrams. It will be seen from FIG. 12 that aluminum can dissolve the silicon of a binary Al-1 wt % Si alloy and be exposed to a temperature as high as 622° C. before any eutectic formation while the silicon of a binary Al-2 wt % Si would provoke the formation of an eutectic when exposed to a temperature as low as 567° C. Similarly, aluminum can dissolve the copper of a binary Al-1 wt % Cu alloy and be exposed to a temperature as high as 645° C. before any eutectic formation while the copper of a binary Al-6 wt % Cu would provoke the formation of an eutectic when exposed to a temperature as low as 548° C. Combining these results, it is anticipated that aluminum could dissolve the silicon and the copper of a ternary Al-1 wt % Si-1 wt % Cu alloy and be exposed to a temperature as high as 622° C. before any Al—Si eutectic formation. The fabrication of integrated circuits with similar aluminum alloys exposed to temperatures exceeding 550° C. has been described by Samsung Electronics Co. Ltd. and has been used in the fabrication of their 4 Mb and 16 Mb DRAM devices: See, for example, Sang-in Lee, Chang-soo Park and Jeong-ha Son, U.S. Pat. No. 5,266,521, "Method for forming a planarized composite metal layer in a semiconductor device", Samsung Electronics Co. Ltd., filed on Jan. 31, 1992 and granted on Nov. 30, 1993; Young-jin Wee, In-seon Park and Sang-in Lee, U.S. Pat. No. 5,814,556, "Method of filling a contact hole in a semiconductor substrate with a metal", Samsung Electronics Co. Ltd., filed on Aug. 15, 1996 and granted on Sep. 29, 1998; Sang-in Lee, Jeong-in Hong, Jong-ho Park and U.S. Pat. No. 5,843,842, "Method for manufacturing a semiconductor device having a wiring layer without producing silicon precipitates", Samsung Electronics Co. Ltd., filed on Sep. 3, 1996 and granted on Dec. 1, 1998; and Integrated Circuit Engineering, Construction analysis report number SCA 9311-3001, "Samsung KM44C4000J-7 16 megabit DRAM", March 1995, 52 pages;

FIG. 13 shows some pictures taken from the ICE's Construction analysis report of Samsung's 16 Mb DRAM and clearly demonstrate that this 16 Mb DRAM device used the upper disclosed high-temperature aluminum reflow technique. The two levels of interconnects are the following:

A first metal, composed of a 0.15 μm thick TiN barrier, a reflowed 0.55 μm thick aluminum alloy and a 0.04 μm thick TiN anti-reflective (cap) layer;

A second metal, composed of a non-reflowed 0.9 μm thick silicon-containing aluminum alloy.

As described in their U.S. Pat. Nos. 5,266,521, 5,814,556, Al-1 wt % Si, Al-0.5 wt % Cu or Al-1 wt % Si-0.5 wt % Cu alloys are heated for a few minutes at a temperature of 550° C. to provoke this the aluminum reflow in the contacts to N+, P+, Poly 1 and Polycide regions and ensure a smooth and planarized top surface. During these few minutes 550° C. aluminum reflow, the underlying TiN barrier layer prevents the underlying silicon material to be dissolved in the aluminum alloy which would result in electrical shorts of the underlying N+ and P+ junctions. The resistance of the TiN barrier at such a high temperature can be improved by some techniques, such as the one described in the following U.S. Pat. No. 6,127,266 to Luc Ouellet, Yves Tremblay and Luc Gendron., but it would still not resist very long exposures at such a high temperature, thus causing breakdown of the TiN barrier and junction leakage. For this reason, the tungsten plug shown in FIG. 11 will be used to contact N+, P+, Poly 1 and other underlying materials under the first level of interconnection of the integrated circuit. It is well known that the tungsten-TiN interface is very resistant to prolonged exposures to very high temperatures.

FIG. 14, also taken from our prior U.S. patent application Ser. No. 10/410,158, shows the interconnection strategy allowing the fabrication of advanced MEMS after the integrated circuit. It involves:

Step 1: The deposition of a Ti/TiN contact layer as to ensure low contact resistance to N+, P+, Poly 1 and other underlying materials followed by the deposition of tungsten layer using chemical vapour deposition, CVD;

Step 2 and Step 3: The etch-back of the CVD-W layer as to leave tungsten plugs in contacts regions followed by the deposition of a TiN/AlSiCu/TiN layer at high temperature over the tungsten plugs, as to form a low resistance interconnect. This approach eliminates the residual problems associated with Sandia's CMOS-first, micromechanics-last MEMS process previously cited as prior art;

Step 4: The pattern of the TiN/AlSiCu/TiN interconnects as to form high temperature stability and low resistance interconnections over which MEMS can be fabricated at temperatures up to 550° C.;

The interconnection strategy described in FIG. 14 allows the fabrication of advanced MEMS after the integrated circuit as shown in FIG. 11. This interconnection strategy constitutes an important element of the present invention because it enables the integration of mechanical parts fabricated at a temperature of ranging between 530° C. and 550° C. Again, this strategy allowing the fabrication of low-stress doped silicon structures at temperatures ranging between 530° C. and 550° C. was also described in our previous patent application referred to above.

It is well known that polysilicon resistivity can be largely reduced by an in-situ doping during deposition by adding to silane some reaction gases such as phosphine (phosphorus n-type doping):

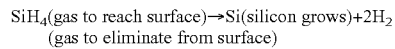
$SiH_4$(gas to reach surface)→Si(silicon grows)+$2H_2$
(gas to eliminate from surface)

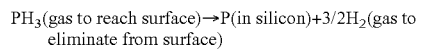
$PH_3$(gas to reach surface)→P(in silicon)+$3/2H_2$(gas to eliminate from surface)

Deposition of in-situ doped silicon at temperatures ranging between 530° C. and 570° C. results in an in-situ phosphorus-doped amorphous silicon material with a very smooth surface finish. FIG. 15 shows the improved surface finish (measured by atomic force microscopy) associated with thick layers of amorphous silicon. Since most MEMS devices use very thick layers of structural material, the improved surface roughness associated with amorphous silicon is a major advantage since it allows the thick structural amorphous silicon to be finely patterned using advanced photolithography equipment.

As also disclosed in our prior patent application referred to above and as shown in FIG. 16, un-doped amorphous silicon deposited at less then about 580° C. results in compressive mechanical stress layers. As also disclosed in the same patent application and as shown in the periodic table of FIG. 17, the 98 picometer atomic radius of phosphorus being much smaller then the 111 picometer atomic radius of silicon, the use of phosphorus in-situ doping of silicon can convert the compressive mechanical stress of un-doped amorphous silicon into a tensile stress phosphorus-doped electrically conductive amorphous silicon having a bulk resistivity of about 1.0 mohm.cm. This effect is shown in FIG. 18. This new technique has the following advantages for MEMS applications:

It allows the fabrication of conductive laminated layers using un-doped compressive stress amorphous silicon and phosphorus-doped tensile stress electrically conductive amorphous silicon without the need for subsequent post-deposition high-temperature diffusions and/or activations to achieve conductive structures;

It provides a uniform phosphorus doping throughout the amorphous silicon film thickness, thus eliminating the effects of micro-structural variations in the thickness direction of some mechanical properties;

It eliminates the bending moments (causing out-of-plane deflections) of mechanically released structures.

The laminated combination of compressive mechanical stress un-doped amorphous silicon shown in FIG. 16 with the tensile mechanical stress phosphorus-doped electrically conductive amorphous silicon shown in FIG. 18 allows the fabrication of laminated structures of FIG. 19 with no residual stress similar to the ones described by the cited prior art references from Siemens Aktiengesellschaft (FIG. 8) and Case Western Reserve University (FIG. 9): Markus Biebl, U.S. Pat. No. 5,753,134, "Method for producing a layer with reduced mechanical stresses", Siemens Aktiengesellschaft, filed on Nov. 23, 1994 and granted on May 19, 1998; Arthur H. Heuer, Harold Kahn and Jie Yang, U.S. Pat. No. 6,268,068, "Low stress polysilicon film and method for producing same", Case Western Reserve University, filed on Mar. 1, 1999 and granted on Jul. 31, 2001; Arthur H. Heuer, Harold Kahn and Jie Yang, U.S. Pat. No. 6,465,045, "Low stress polysilicon film and method for producing same", Case Western Reserve University, filed on Oct. 18, 2000 and granted on Oct. 15, 2002; Arthur H. Heuer, Harold Kahn, Jie Yang and Stephen M. Phillips, U.S. Pat. No. 6,479,166, "Large area polysilicon films with predetermined stress characteristics and method for producing same", Case Western Reserve University, filed on May 1, 2000 and granted on Nov. 12, 2002; Jie Yang, Harold Kahn, An-Qiang He, Stephen M. Phillips and Arthur H. Heuer, "A new technique for producing large-area as-deposited zero-stress LPCVD polysilicon films: The multipoly process", IEEE Journal of microelectromechanical systems, Vol. 9, No. 4, December 2000, pp. 485-494.

Unlike these two cited prior art references our co-pending patent application referred to above discloses that it is possible to produce at a temperature compatible with an underlying integrated circuit a low mechanical stress and stress gradient laminated structure in a single integrated cycle in a low-temperature reactor without the need for air exposures, without the need for interfacial auxiliary oxide layers, without the need for dopant implantation, without the need for high temperature dopant diffusion and/or activation in a furnace or a rapid thermal processor in order to produce by surface micro-machining over a previously fabricated integrated circuit incorporating CMOS, bipolar, Bi-CMOS and/or high-voltage devices low-stress mechanical structures allowing the mechanical functions of the integrated MEMS device over its control electronics. FIG. 20 shows the evidence of such low-temperature (550° C. with no post-deposition heat treatments), low-stress and low stress gradient phosphorus-doped and un-doped laminated structures mechanically released from their underlying sacrificial material as to suspend these in air. The observed flat cantilevers demonstrate the excellent mechanical properties of these phosphorus-doped and un-doped laminated structures.

As also disclosed in our co-pending patent application, the phosphorus incorporation rate into the growing amorphous silicon is characterized by the following phosphine pyrolisis reaction:

$PH_3$(at the surface)→P(incorporation in Si)+3/2$H_2$(escape from the surface) and the phosphorus incorporation is reaction-rate limited and follows the following Arrhenius equation:

$$R = R_o \exp(-E_a'/kT)$$

where $E_a'$ an activation energy (eV), k is Boltzmann's constant and T is the temperature (K). This means that the amount of incoming phosphine is controlled such that it does not limit this phosphorus incorporation reaction at the deposition temperature of 530° C. to 550° C. so the phosphorus incorporation into the growing phosphorus-doped amorphous silicon is dictated by the deposition temperature, thus resulting in a fixed phosphorus incorporation and a fixed mechanical stress at a given growth temperature.

FIG. 21 shows that the bulk resistivity of the phosphorus-doped amorphous silicon typically obtained from the deposition at 550° C. reaches a minimum of 1.0 mohm.cm above a certain phosphine mass flow rate. For a typical 550° C. deposition using a silane mass flow rate of 253 standard cubic centimeter per minute (sccm) a minimum phosphine mass flow rate of 0.36 sccm is required to achieve this minimum bulk resistivity of 1 mohm.cm. At a lower deposition temperature of 530° C. a minimum bulk resistivity of 0.7 mohm.cm is observed above a certain phosphine mass flow rate. These two observations are very important for the following two reasons:

Firstly, as shown in FIG. 21, to this low bulk resistivity of 1 mohm.cm is associated a carrier concentration of about $8.0 \times 10^{19}/cm^3$ (electrons are the carriers because phosphorus is in the fifth column of the periodic table and then phosphorus-doped silicon is an N-type material). Knowing that silicon contains about $4.4 \times 10^{22}$ silicon atoms per $cm^3$ of silicon material, then the number of electron carriers per silicon atom has to be about $(8.0 \times 10^{19}/cm^3)/(4.4 \times 10^{22}/cm^3)$ or 0.18%. This first observation is by itself very significant because it is about the ratio of this minimum phosphine molecules per silane molecules (0.36 sccm)/(253 sccm) or 0.14%. Knowing that to each incorporated phosphorus atom in the silicon network is associated a free electron, than one must admit that about (0.14%/0.18%) or about 77% of the phosphine molecules entering the deposition equipment are actually incorporated in the deposited phosphorus-doped amorphous silicon layers. This very efficient phosphorus incorporation of about 77% results from the optimization of this reaction-rate limited process for which a slight excess of phosphine is incorporated in the deposition equipment. This first observation then indicates that:

Most phosphine molecules participate in the reaction by releasing their phosphorus atoms at the surface, i.e. phosphine is easily decomposed to metallic phosphorus at 550° C.:

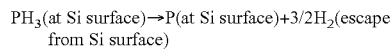
$PH_3$(at Si surface)→P(at Si surface)+3/2$H_2$(escape from Si surface)

Most phosphorus atoms released at the silicon surface are actually incorporated in the depositing silicon film, i.e. the atomic phosphorus does not have a too high vapour pressure and its "residence time" onto the surface allows its incorporation into the growing silicon surface:

P(at Si surface)→P(into the Si volume)

Above a certain minimum mass flow rate of phosphine is then associated a fixed bulk resistivity associated to a fixed phosphorus incorporation rate above which the excess phosphorus must escape from the surface i.e. the phosphorus-doped silicon has achieved the so-called phosphorus solubility limit at 550° C.:

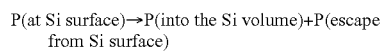
P(at Si surface)→P(into the Si volume)+P(escape from Si surface)

Secondly, at a lower deposition temperature of 530° C. is observed a minimum bulk resistivity of 0.7 mohm.cm above a certain phosphine mass flow rate. FIG. 21 shows that to such a 0.7 mohm.cm bulk resistivity is associated a carrier concentration of about $1.5 \times 10^{20}/cm^3$, and then even more phosphorus incorporation. FIG. 21 also shows that the lowest bulk resistivity value of phosphorus-doped epitaxial silicon layer is about 10 mohm.cm, as disclosed in the following specification sheets of BCO Technologies, a state-of-the-art wafer supplier: http://www.bco-technologies.com/proservices/substrate/; http://www.bco-technologies.com/proservices/sisi/.

This lowest bulk resistivity of 10 mohm.cm reported by BCO Technologies is yet about 10 times higher then the bulk resistivity of our phosphorus-doped amorphous silicon. FIG. 22, taken from the reference ELEC 507 "Microelectronics Fabrication Technology", a course given in Fall 2002 by the Electrical & Electronic Engineering department of Hong Kong University of Science and Technology, shows that the solubility limit of phosphorus drops very rapidly as function of temperature and that about $10^{21}/cm^3$ phosphorus atoms can still be dissolved in silicon at the typical silicon epitaxy temperatures of 900 to 1200° C. using phosphine as phosphorus dopant source. Similarly, FIG. 23, taken from the reference ECE 467 "Introduction to VLSI—Introduction to IC Manufacture and Processing", a course given in Fall 2002 by the Electrical and Computer Engineering department of University of Illinois at Chicago, also shows that the solubility limit of phosphorus drops very rapidly as function of temperature and that about $10^{21}/cm^3$ phosphorus atoms can still be dissolved in silicon at the typical silicon epitaxy temperatures of 900 to 1200° C. and using phosphine as phosphorus dopant source. Considering again FIG. 21, the bulk resistivity of phosphorus-doped epitaxial silicon should then be much lower then 1 mohm.cm bulk resistivity if the phosphorus atoms resulting from the thermal decomposition of phosphine could be incorporated up to these solubility limits of $10^{21}P/cm^3$. The phosphorus atoms resulting from the thermal decomposition of phosphine (which should be absolutely complete at these high temperatures since it is apparently complete at our much lower temperature of 550° C.) are not incorporated up to the solubility limit of $10^{21}P/cm^3$ during silicon epitaxy at temperatures between 900° C. and 1200° C. and the resulting bulk resistivity is then lower then what could be the resistivity associated with such a high level of phosphorus incorporation. The explanation of this effect must be related to a poor incorporation of phosphorus in the volume of the depositing silicon film

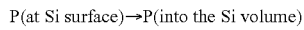

and the atomic phosphorus must have a too high vapour pressure at these high temperatures and its "residence time" onto the surface prevents its incorporation into the growing silicon surface i.e. the phosphorus-doped epitaxial silicon cannot achieved the so-called phosphorus solubility limit at 900° C. to 1200° C. due to:

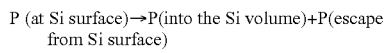

This second reason explains the fact that most of the cited Prior Art techniques based on the use of phosphorus-doped epitaxial silicon still require an extra doping using a solid source (phosphosilicate glass) or low vapour pressure phosphorus source ($POCl_3$) to achieve, at much higher diffusion temperatures of 1000° C. to 1100° C. the same low bulk resistivity of about 1 mohm.cm achieved by our disclosed technique involving phosphorus-doped amorphous silicon at 550° C. using an optimized phosphorus doping process. FIG. 24, taken from the reference AP 4120 "Microelectronic Materials and Processing—Polysilicon and Dielectric Film Deposition", a course given in 2002 by the Department of Physics & Materials Science department of City University of Hong Kong, shows this evidence by comparing the bulk resistivity achieved using the three commonly used techniques: a high-temperature phosphorus diffusion at temperatures of 1000° C. to 1100° C., a high dose phosphorus implantation and a typical in-situ phosphorus-doped polysilicon. It is clear that our disclosed technique involving phosphorus-doped amorphous silicon at 550° C. using an optimized phosphorus doping process is unsurpassed in term of bulk resistivity at such a low process temperature.

The laminated combination of compressive mechanical stress un-doped amorphous silicon shown in FIG. 16 with the tensile mechanical stress phosphorus-doped electrically conductive amorphous silicon shown in FIG. 18 allows the fabrication of laminated structures of FIG. 19 with no residual stress similar to the ones shown in FIG. 20. The resulting laminated structures of FIG. 19 have very conductive tensile stress and phosphorus-doped amorphous silicon layers characterized by an un-matched low bulk resistivity of 1 mohm.cm capable of planar electrical conductance in the plane of the substrate. Unfortunately, these very conductive layers are semi-isolated from each other via the compressive stress and semi-insulating un-doped layers, thus preventing an efficient conductance normal to the plane of these layers.

The integration of modular MEMS devices directly over a previously fabricated integrated circuit is certainly possible with these low stress gradient laminated structures because the maximum exposure temperature of 550° C. is now compatible with tungsten-filled contacts and its underlying high quality titanium nitride barrier/glue layer. More, the integration of these modular MEMS devices over an integrated circuit benefit from the smooth surface topology profile resulting from these amorphous silicon layers and eliminate the complex processing related to the alternate approach requiring extensive planarization of the thick structures composing the MEMS devices as to allow precision photolithography to be performed with modern exposure equipment having small depth of focus.

The semi-insulating nature of the compressive stress and semi-insulating un-doped layers of these laminated structures would benefit from an alternate solution involving the replacement of these compressive stress and semi-insulating un-doped layers by compressive stress and high electrical conductivity layers doped with another dopant capable of producing this compressive stress (N-type as to prevent the formation of PN diodes with the surrounding N-type tensile stress phosphorus-doped layers) and, more importantly, these laminated structures would benefit to be replaced by non-laminated and homogeneous structures involving the in-situ doping of amorphous silicon with phosphorus (causing a tensile stress) and another N-type dopant (causing a compressive stress) as another more important alternate solution as to achieve a homogeneous, low temperature, low stress, low stress gradient, low surface roughness and highly conductive amorphous silicon to produce these advanced MEMS devices over an integrated circuit.

The processes described in the above prior art documents cannot allow the fabrication of advanced MEMS devices after the integrated circuit because of their excessive high-temperature stress-relief.

Analog Devices' Modular MEMS process requires the CMOS devices to be fabricated in a thick polished (using CMP) selective epitaxial silicon layer after the mechanical parts are fabricated. In that case, the epitaxial silicon deposition at a temperature of about 1000-1200° C. and the well diffusions of the integrated circuit allow the stress relief of the structural polysilicon.

Samsung Advanced Institute of Technology's MEMS process also requires the CMOS devices to be fabricated after the mechanical parts. In this case, the 16 hours duration 1200° C. drive-in diffusion of the p-well implant of the integrated circuit is used as stress-relief of the microstructural polysilicon.

Sandia National Laboratories' IMEMS process also requires the CMOS, bipolar or BiCMOS devices to be fabricated after the mechanical parts. Again, a high-temperature stress-relief at temperatures of the order of 1000° C. is performed after the mechanical parts prior fabricating the integrated circuit as to ensure that the subsequent thermal budget required integrated circuit processing will not affect the mechanical properties of the mechanical parts; MEMSCAP's Polysilicon Multi-User MEMS (PolyMUMPs) process requires three successive (1 hour each) 1050° C. exposures to dope and stress-relief the three layers of polysilicon doped by the phosphorus diffusing from the neighboring phosphosilicate layers. Again, any tentative of integrating CMOS devices to the MUMPs process would require the integrated circuit to be fabricated AFTER the mechanical parts as to prevent the destruction of the junctions during these three 1050° C. exposures;.

Robert Bosch GmbH's surface micromachining process requires two high-temperature exposures: A first one, at 1000° C. in an oxygen ambient, to drive and activate the Sb dopant of a first polysilicon layer; and a second one, at about 1100° C., for the deposition of the second structural epipoly layer. Again, this process requires the integrated circuit to be fabricated after the mechanical parts as to prevent the destruction of the junctions during such restrictive heat treatments. Sandia National Laboratories' CMOS-first, micromechanics-last MEMS process describes the fabrication the CMOS devices BEFORE the mechanical parts but still requires a very restrictive 3 hours duration and 1100° C. stress-relief of the structural polysilicon following the integrated circuit fabrication. To enhance the thermal stability of the integrated circuit, aluminum interconnects are COMPLETELY replaced by 1.0 µm thick low-stress tungsten interconnects deposited by chemical vapor deposition, CVD over a titanium nitride, TiN, barrier layer. The process is yet unstable because of various issues related to: tungsten delamination and lifting at bond pads, tungsten surface roughness imposing manual photolithography, TiN barrier layer failure during the 3 hours, 1100° C. stress-relieve and boron out-diffusion during the 3 hours, 1100° C. stress-relief. These limitations caused Sandia to drop this idea and look for other approaches besides the all-tungsten, CMOS-first, micromechanics-last MEMS process.

University of Michigan's process describes the deposition of a low-stress un-doped polysilicon at a temperature of about 588-610° C. followed by the diffusion and activation at 950° C.-1050° C. (for one to a few hours in nitrogen) of a phosphorus implantation at an energy of 50 keV-100 keV and a dose of about $7E15/cm^2$-$2E16/cm^2$ as to increase the electrical conductivity of the deposited polysilicon and reduce its mechanical stress to about 25 MPa. Again, the required 950° C.-1050° C. diffusion and activation of the phosphorus implantation again forces the integrated circuit to be fabricated after the MEMS process as to prevent the destruction of the junctions during such restrictive heat treatments.

UC Berkeley's low-stress un-doped porous polysilicon process describes an un-doped low residual stress porous polysilicon deposited at 597° C.-605° C. under special conditions which requires its doping and activation at a high-temperature ranging between 950° C. and 1050° C. as to achieve low-stress conductive permeable polysilicon material. Again, the required 950° C.-1050° C. diffusion and activation of the low residual stress porous polysilicon again forces the integrated circuit to be fabricated after the MEMS process as to prevent the destruction of the junctions during such restrictive heat treatments.

U. of Wisconsin's low-stress re-crystallized polysilicon process describes the 591° C. deposition of a 2.0 µm thick 300 MPa compressive stress un-doped silicon film having two phases: A bottom un-doped polycrystalline phase and an upper un-doped amorphous phase. A post-deposition stress relief at a temperature below 835° C. allows this film to be converted to a re-crystallized un-doped film with a tensile stress of as low as 20 MPa. The post-deposition diffusion and activation of these un-doped re-crystallized films at a temperature between 950° C.-1050° C. again forces the integrated circuit to be fabricated, after the MEMS process so as to prevent the destruction of the junctions during such restrictive heat treatments.

Siemens Aktiengesellschaft's low-stress layered polysilicon process describes a technique to form an low mechanical stress un-doped silicon-based laminated structure using a first high-temperature compressive stress un-doped polysilicon, a first auxiliary $SiO_2$ layer, a second low-temperature tensile stress un-doped amorphous silicon, a second auxiliary $SiO_2$ layer, a third high-temperature compressive stress un-doped polysilicon, a third auxiliary $SiO_2$ layer and a fourth low-temperature tensile stress amorphous un-doped silicon. Again, post-deposition diffusions and activations of these laminated un-doped layers by four independent rapid thermal activations, RTA, at approximately 1000° C. again force the integrated circuit to be fabricated after the MEMS process as to prevent the destruction of the junctions during such restrictive heat treatments;

Case Western Reserve University's low-stress layered polysilicon process describes the fabrication of a 3.0 µm thick low tensile stress (+7 MPa) laminated structures involving the sequential combination of five low-temperature (570° C. or lower) +200 MPa tensile stress amorphous (or devitrified) un-doped silicon layers and of four high-temperature (615° C.)-200 MPa compressive stress un-doped polysilicon layers with no auxiliary $SiO_2$ layers in a single deposition run, without atmospheric exposure. Again, the post-deposition diffusion and activation of this un-doped laminated structure by RTA or furnace activation at approximately 1000° C. for a duration sufficiently long as to uniformly dope and reduce the electrical resistance of the obtained 3 µm thick laminated structure again forces the integrated circuit to be fabricated after the MEMS process as to prevent the destruction of the junctions during such restrictive heat treatments;

UC Berkeley's low-stress re-crystallized in-situ doped polysilicon process describes a low-stress re-crystallized in-situ doped polysilicon deposited at a temperature of about 585-590° C. at a relatively rapid rate providing a film with a crystallographic inhomogeneity observed as polysilicon grains near the underlying oxide interface which progressively disappear toward the upper surface. This non-homogeneous crystalline structure results in a stress gradient and requires a short duration 950° C. RTA to achieve a low tensile stress with negligible stress gradient throughout the film thickness. Again, the short 950° C. RTA of the non-homogeneous crystalline structure forces the integrated circuit to be fabricated after the MEMS process as to prevent the destruction of the junctions and the interconnects during such restrictive heat treatments;

None of the cited prior art references described a process which can allow the fabrication of advanced MEMS devices after the integrated circuit because to each of these are associated an excessive high-temperature treatment to stress-relief, dope or activate the dopants of the deposited silicon.

Our co-pending patent application referred to above describes a strategy that permits the fabrication of a MEM device using low stress laminated structures (FIG. 19, FIG. 20) of tensile stress phosphorus-doped (FIG. 18) and compressive stress un-doped layers (FIG. 16) of amorphous silicon over the aluminum alloy interconnections of an integrated circuit (FIG. 11), thus imposing an upper limit to the process temperature of about 550° C. and the use of tungsten plugs over titanium and titanium nitride layers to contact N+, P+, Poly 1 and other underlying materials under the first level of interconnection of the integrated circuit incorporating CMOS, bipolar, Bi-CMOS and/or high-voltage devices low-stress mechanical structures allowing the mechanical functions of the integrated MEMS device over its control electronics. The low bulk resistivity of the phosphorus-doped amorphous silicon typically obtained from the deposition at 550° C. reaches a minimum of 1.0 mohm.cm (FIG. 21) above a certain phosphine mass flow rate characterized by up to 77% of atomic phosphorus incorporation into the phosphorus-doped amorphous silicon due to an efficient phosphine decomposition to metallic phosphorus, due to an efficient phosphorus incorporation into the growing silicon resulting from a sufficiently low vapour pressure and a sufficiently long enough "residence time" onto the growing silicon surface which allows the tensile stress phosphorus-doped layers to achieve an un-surpassed low bulk resistivity of 1 mohm.cm without any extra doping using a solid source (phosphosilicate glass) or a low vapour pressure phosphorus source ($POCl_3$) at without any high diffusion temperatures of about 1000° C. to 1100° C. The resulting low-stress and low stress gradient laminated structure has very conductive tensile stress and phosphorus-doped amorphous silicon capable of planar electrical conductance in the plane of the substrate.

Unfortunately, the inefficient conductance normal to the plane of these layers due to the semi-insulating nature of the compressive stress un-doped layers is not optimum and it would be desirable to replace these laminated structures by non-laminated and homogeneous structures.

Also, the integration of moving mechanical parts, of controlling, sensing or interfacing integrated circuits and, sometimes, of high-voltage integrated circuits capable of powerful actuation of the mechanical parts has previously been limited by the need for high-temperature stress-relief of polysilicon at temperatures exceeding 1000° C.

In our co-pending United States patent applications referred above we disclosed a new method for the fabrication of a micro-electro-mechanical (MEM) device over an electronic device on a common substrate using a low mechanical stress and a low stress gradient laminated structure composed of at least one un-doped semi-insulating amorphous silicon and one phosphorus-doped electrically conductive amorphous silicon. This previous patent application discloses that this low-temperature, low stress and low stress gradient laminated structure is obtained from the combination of at least one un-doped, semi-insulating and compressive mechanical stress amorphous silicon layer deposited at a temperature of 520 to 580° C. from silane at a partial pressure of 100 to 5000 mTorr to achieve a compressive mechanical stress of −0.01 to −400 MPa; and at least one phosphorus-doped electrically conductive and tensile mechanical stress amorphous silicon layer deposited at a temperature of 520 to 580° C. from silane at a partial pressure of 100 to 5000 mTorr and from phosphine at a partial pressure of 0.1- to 5.0 mTorr to achieve a tensile mechanical stress of +0.01 to +400 MPa and a bulk resistivity of 0.1 to 1000 mohm.cm.

This process permits the fabrication of a laminated structure having a low residual mechanical stress of less than +/−100 MPa and a low stress gradient of less then +/−20 MPa/µm and preferably of less then +/−5 MPa/µm. Although mechanically desirable for most applications, this low-stress and low stress gradient laminated structure composed of un-doped semi-insulating amorphous silicon and of phosphorus-doped electrically conductive amorphous silicon has electrical limitations due to the semi-insulating nature of the un-doped and compressive mechanical stress amorphous silicon.

SUMMARY OF THE INVENTION

The invention provides an electrically conductive substitute layer for the un-doped compressive mechanical stress amorphous silicon and an improved technique allowing the fabrication of advanced MEMS after the integrated circuit. This technique eliminates the excessive high-temperature treatment to stress-relieve, dope or activate the dopants of the deposited silicon. The invention permits the fabrication, at low-temperature, of an electrically conductive, low stress, low stress gradient and homogeneous amorphous silicon obtained from the deposition of a homogeneous and electrically conductive amorphous silicon.

According to the present invention there is provided a method of fabricating a silicon-based microstructure, wherein electrically conductive amorphous silicon doped is deposited with first and second dopants to produce a structure having a residual mechanical stress of less than +/−100 Mpa, said first dopant being selected from the group consisting of arsenic, antimony, and bismuth; and said second dopant being phosphorus.

The microstructure can either be a laminated structure, in which the amorphous silicon is deposited as successive layers, or a homogenous structure, in which case the amorphous silicon is simultaneously doped.

The invention permits the elimination of the electrical limitation related to the un-doped compressive mechanical stress amorphous silicon by replacing un-doped compressive mechanical stress amorphous silicon by an arsenic-doped (or antimony-doped) compressive mechanical stress amorphous silicon to allow the fabrication, at low-temperature, of a low stress and low stress gradient laminated structure.

The invention thus employs a combination of at least one arsenic-doped (or antimony-doped) electrically conductive and compressive mechanical stress amorphous silicon layer preferably deposited in-situ at a temperature of 520 to 580° C. from a silane partial pressure of 100 to 5000 mTorr and from an arsine (or stibine) partial pressure of 0.01 to 50.0 mTorr as to achieve a compressive mechanical stress of −0.01 to −400 MPa and a bulk resistivity of 0.01 to 1000 mohm.cm, and at least one phosphorus-doped electrically conductive and tensile mechanical stress amorphous silicon layer preferably deposited at a temperature of 520 to 580° C. from a silane partial pressure of 100 to 5000 mTorr and from a phosphine partial pressure of 0.1 to 5.0 mTorr.

This combination results in a tensile mechanical stress of +0.01 to +400 MPa and a bulk resistivity of 0.1 to 1000 mohm.cm. The result is a laminated structure having a low residual mechanical stress of less than +/−100 MPa, a low stress gradient of less than +/−20 MPa/µm and preferably of less than +/−5 MPa/µm.

The invention also permits the production, at low temperature, of an electrically conductive, low stress, low stress gradient and homogenous amorphous silicon obtained from the in-situ deposition using the simultaneous doping with arsenic (or antimony) and phosphorus preferably at a temperature of 520 to 580° C. from a silane partial pressure of 100 to 5000 mTorr, from an arsine (or stibine) partial pressure of 0.01 to 50.0 mTorr and from a phosphine partial pressure of 0.1 to 5.0 mTorr so as to achieve a homogeneous material having a bulk resistivity of 0.01 to 1000 mohm.cm, a low residual mechanical stress of less than +/−100 MPa and a low stress gradient of less then +/−20 MPa/µm and preferably of less than +/−5 MPa/µm.

The achievement at such a low temperature of a homogeneous material characterized by a low bulk resistivity, a low residual mechanical stress and a low stress gradient allows the fabrication of advanced MEMS without the typical excessively high-temperature required to stress-relieve this silicon material and without the upper-mentioned electrical conductivity limitation and then allows even more advanced MEMS to be fabricated over integrated circuits than the ones described in our co-pending patent application referred to above.

BRIEF DESCRIPTION OF THE DRAWINGS

The invention will now be described in more detail, by way of example only, with reference to the accompanying drawings, in which:—

FIG. 7 shows UC Berkeley's low-stress un-doped porous polysilicon;
FIG. 9 shows Case Western Reserve University's low-stress laminated silicon structures;
FIG. 12 shows Al—Si and Al—Cu phase diagrams;
FIG. 13 shows Samsung's 16 Mb DRAM using a high-temperature aluminum reflow technique;
FIG. 17 shows the phosphorus atomic radius against that of silicon;
FIG. 20 shows a stress-free laminated structures made from un-doped and phosphorus-doped amorphous silicon;
FIG. 25 shows that the arsenic atomic radius is same as that of silicon;
FIG. 26 shows the low surface roughness, low stress and low stress gradient laminated combination of compressive mechanical stress arsenic-doped, antimony-doped or bismuth-doped electrically conductive amorphous silicon with the tensile mechanical stress phosphorus-doped electrically conductive amorphous silicon (the arsenic-doped and phosphorus-doped laminated amorphous silicon is illustrated);

FIG. 27 shows the he low surface roughness, low stress and low stress gradient arsenic-doped and phosphorus-doped homogeneous amorphous silicon or alternately of antimony-doped and phosphorus-doped homogeneous amorphous silicon or alternately bismuth-doped and phosphorus-doped homogeneous amorphous silicon (the arsenic-doped and phosphorus-doped homogeneous amorphous silicon is illustrated);

FIG. 29 shows the standard Gibbs energy of formation (kJ/mol) of hydrogen compounds at 25° C.;

DETAILED DESCRIPTION

The elements of the periodic table composing the Group 15 are the ones capable of N-type doping silicon. These include: Nitrogen (Period 2), Phosphorus (Period 3), Arsenic (Period 4), Antimony (Period 5) and Bismuth (Period 6). The periodic table shown in FIG. 25 shows that the atomic radius of the elements of this Group 15 gradually increases as the Period increases from 2 to 6: Nitrogen has an atomic radius of 56 picometers, phosphorus has an atomic radius of 98 picometers, arsenic has an atomic radius of 114 picometers, antimony has an atomic radius of 133 picometers and bismuth has an atomic radius of 143 picometers. Comparing these atomic radii to the 111 picometers atomic radius of silicon atoms, it seems that replacing some silicon atoms of the silicon cubic lattice by arsenic, antimony or bismuth atoms would effectively result in an N-type silicon with a built-in compressive stress generated from the increased atomic radius associated with these elements.

Figure 16:
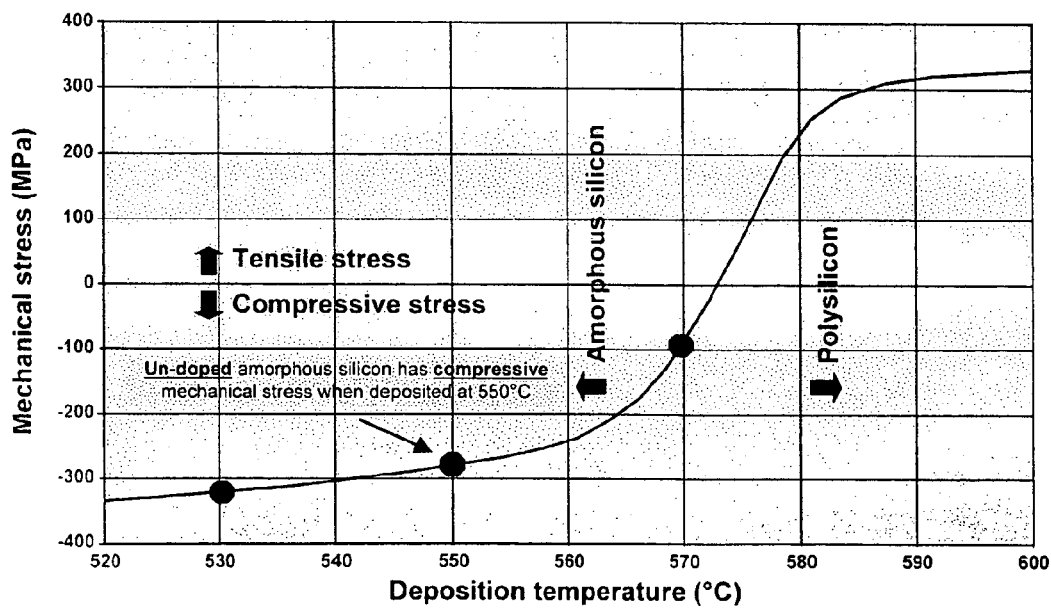
FIG. 16 shows the Compressive mechanical stress of un-doped amorphous silicon.
Figure 18:
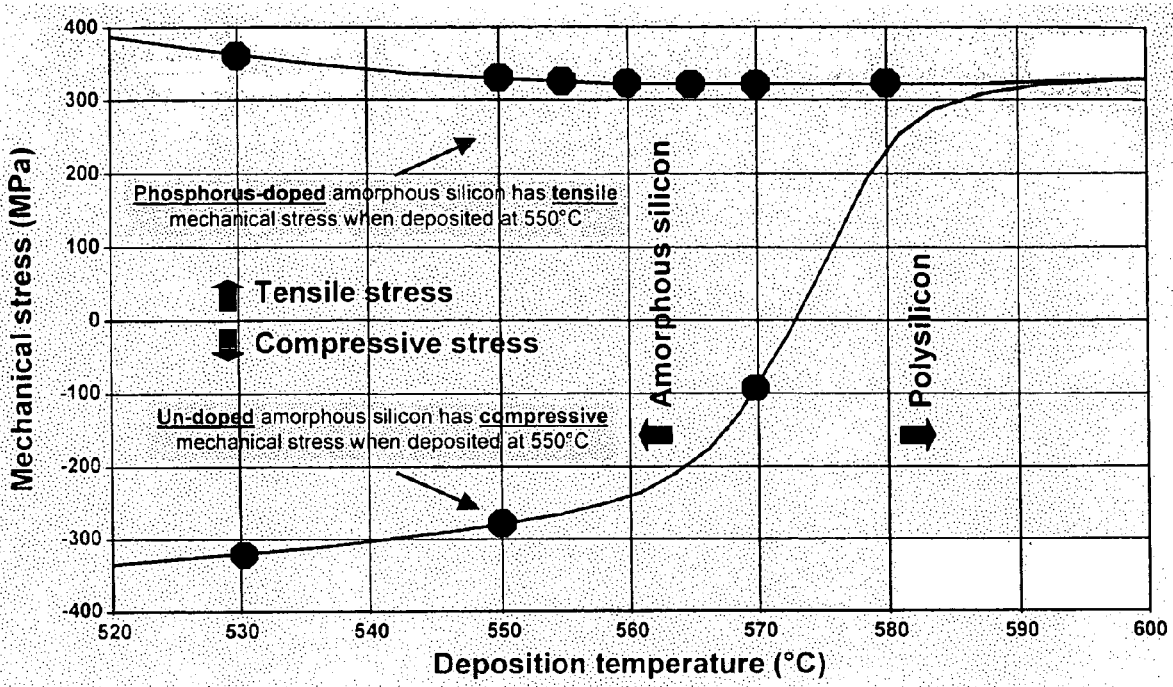
FIG. 18 shows the tensile mechanical stress of phosphorus-doped amorphous silicon.

As disclosed in our co-pending patent application and as shown in FIG. 16, un-doped amorphous silicon deposited at less than about 580° C. results in compressive mechanical stress layers.

The incorporation of such arsenic, antimony or bismuth atoms in the amorphous silicon deposited at temperatures ranging between 530° C. and 570° C. results in the required compressive mechanical stress N-type doped amorphous silicon. This incorporation is possible by in-situ doping the amorphous silicon deposition by adding to silane some reaction gases such as arsine, $AsH_3$, stibine, $SbH_3$, or bismuthine, $BiH_3$ as exemplified by the following reactions:

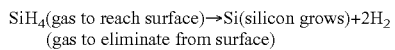
$SiH_4$(gas to reach surface)→Si(silicon grows)+$2H_2$ (gas to eliminate from surface)

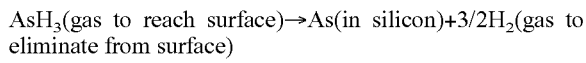
$AsH_3$(gas to reach surface)→As(in silicon)+$3/2H_2$(gas to eliminate from surface)

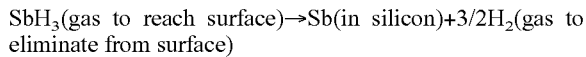
$SbH_3$(gas to reach surface)→Sb(in silicon)+$3/2H_2$(gas to eliminate from surface)

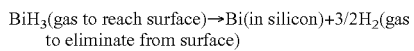
$BiH_3$(gas to reach surface)→Bi(in silicon)+$3/2H_2$(gas to eliminate from surface)

Figure 15:
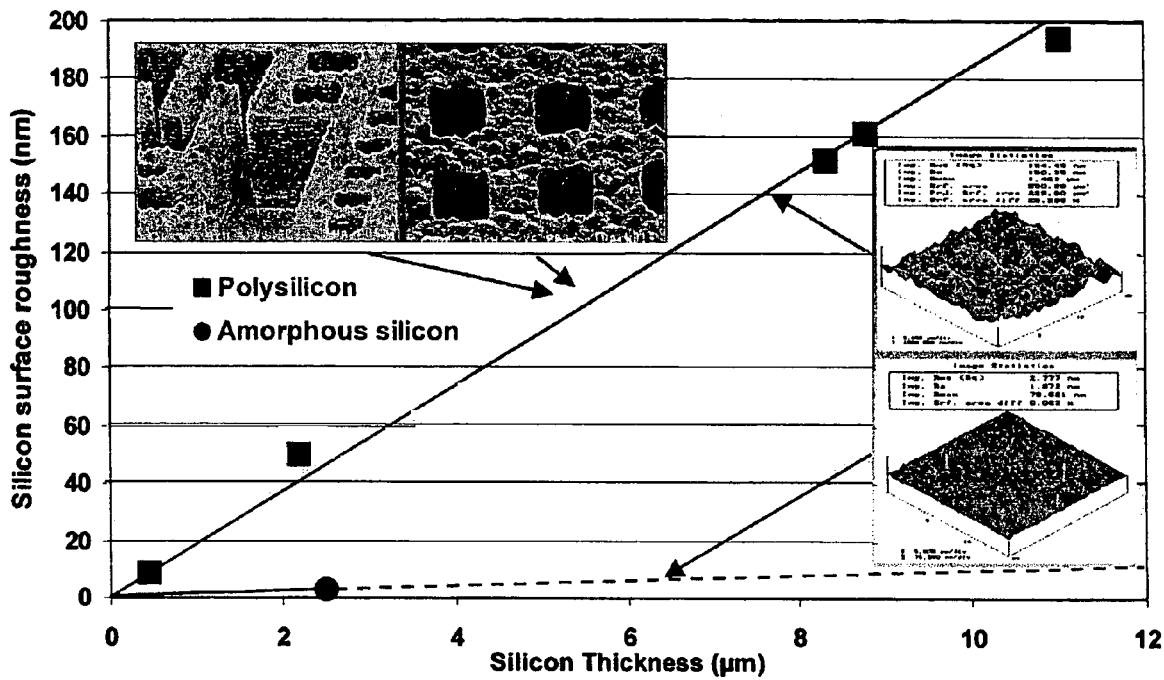
FIG. 15 shows atomic force microscopy measurements of the surface roughness of amorphous and polysilicon layers.

These reactions permit the in-situ N-type doped compressive mechanical stress amorphous silicon material with a very smooth surface finish such as the one shown in FIG. 15. This improved surface roughness associated with this in-situ doped amorphous silicon is very important since most MEMS devices use very thick layers of structural material and require this thick structural amorphous silicon to be finely patterned using advanced photolithography equipment affected by any roughness of the surface. The achievement of in-situ N-type doped compressive mechanical stress amorphous silicon results in the following advantages for MEMS applications:

The fabrication low surface roughness, low stress and low stress gradient conductive laminated structure composed of arsenic-doped, antimony-doped or bismuth-doped compressive stress electrically conductive amorphous silicon layers and phosphorus-doped tensile stress electrically conductive amorphous silicon layers without the need for subsequent post-deposition high-temperature diffusions and/or activations, or more importantly;

The fabrication low surface roughness, low stress and low stress gradient conductive homogeneous structure using either an arsenic-doped and phosphorus-doped homogeneous electrically conductive amorphous silicon or alternately using an antimony-doped and phosphorus-doped homogeneous electrically conductive amorphous silicon or alternately using a bismuth-doped and phosphorus-doped homogeneous electrically conductive amorphous silicon without the need for subsequent post-deposition high-temperature diffusions and/or activations.

This allows the production (at a temperature compatible with an underlying integrated circuit) a low mechanical stress and stress gradient laminated structure in a single integrated cycle in a low-temperature reactor without the need for air exposures, without the need for interfacial auxiliary oxide layers, without the need for dopant implantation, without the need for high temperature dopant diffusion and/or activation in a furnace or a rapid thermal processor in order to produce by surface micro-machining over a previously fabricated integrated circuit incorporating CMOS, bipolar, Bi-CMOS and/or high-voltage devices low-stress mechanical structures allowing the mechanical functions of the integrated MEMS device over its control electronics.

The low surface roughness, low stress and low stress gradient laminated combination of compressive mechanical stress arsenic-doped, antimony-doped or bismuth-doped electrically conductive amorphous silicon with the tensile mechanical stress phosphorus-doped electrically conductive amorphous silicon is shown in FIG. 26.

The low surface roughness, low stress and low stress gradient arsenic-doped and phosphorus-doped homogeneous amorphous silicon or alternately of antimony-doped and phosphorus-doped homogeneous amorphous silicon or alternately bismuth-doped and phosphorus-doped homogeneous amorphous silicon is shown in FIG. 27.

The arsenic, antimony or bismuth incorporation rate into the growing amorphous silicon is characterized by the following pyrolisis reactions:

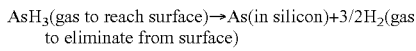
AsH$_3$(gas to reach surface)→As(in silicon)+3/2H$_2$(gas to eliminate from surface)

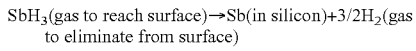
SbH$_3$(gas to reach surface)→Sb(in silicon)+3/2H$_2$(gas to eliminate from surface)

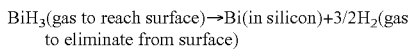
BiH$_3$(gas to reach surface)→Bi(in silicon)+3/2H$_2$(gas to eliminate from surface)

The deposition conditions are to be such that the arsenic, antimony or bismuth incorporation is reaction-rate limited and follows the following Arrhenius equation:

$$R=R_o\exp(-E_a'/kT)$$

where $E_a'$ an activation energy (eV), k is Boltzmann's constant and T is the temperature (K). This means that the amount of incoming arsine, stibine or bismuthine is controlled such that it does not limit this arsenic, antimony or bismuth incorporation reaction at the deposition temperature of 530° C. to 550° C. so that the arsenic, antimony or bismuth incorporation into the growing amorphous silicon is dictated by the deposition temperature, thus resulting in a fixed arsenic, antimony or bismuth incorporation and a fixed mechanical stress at a given growth temperature.

Figure 21:
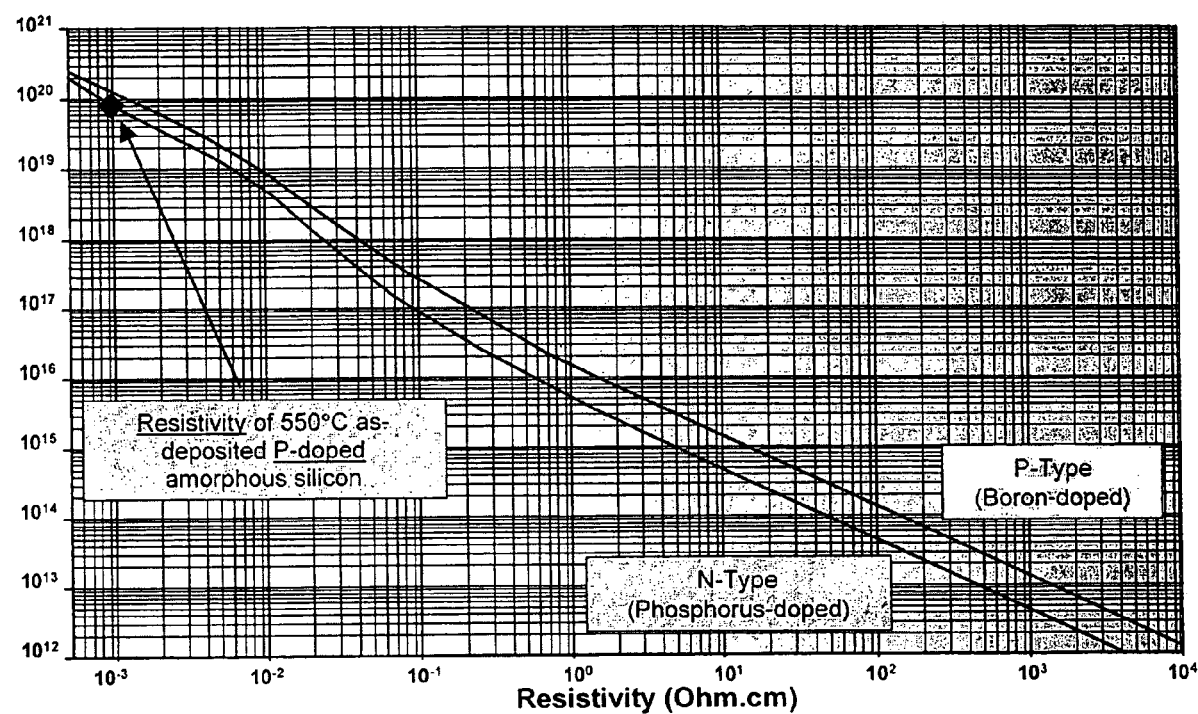
FIG. 21 shows the bulk resistivity of phosphorus-doped amorphous silicon.

It was shown with reference to FIG. 21 that the minimum bulk resistivity of the phosphorus-doped amorphous silicon of 1.0 mohm.cm is associated with a carrier concentration of about $8.0\times10^{19}/cm^3$ and a very efficient phosphorus incorporation of about 77% at a deposition temperature of 550° C. This means that most phosphine molecules participate in the reaction by releasing their phosphorus atoms at the surface, i.e. phosphine is easily decomposed to metallic phosphorus at 550° C.:

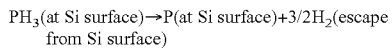
PH$_3$(at Si surface)→P(at Si surface)+3/2H$_2$(escape from Si surface)

Figure 28:
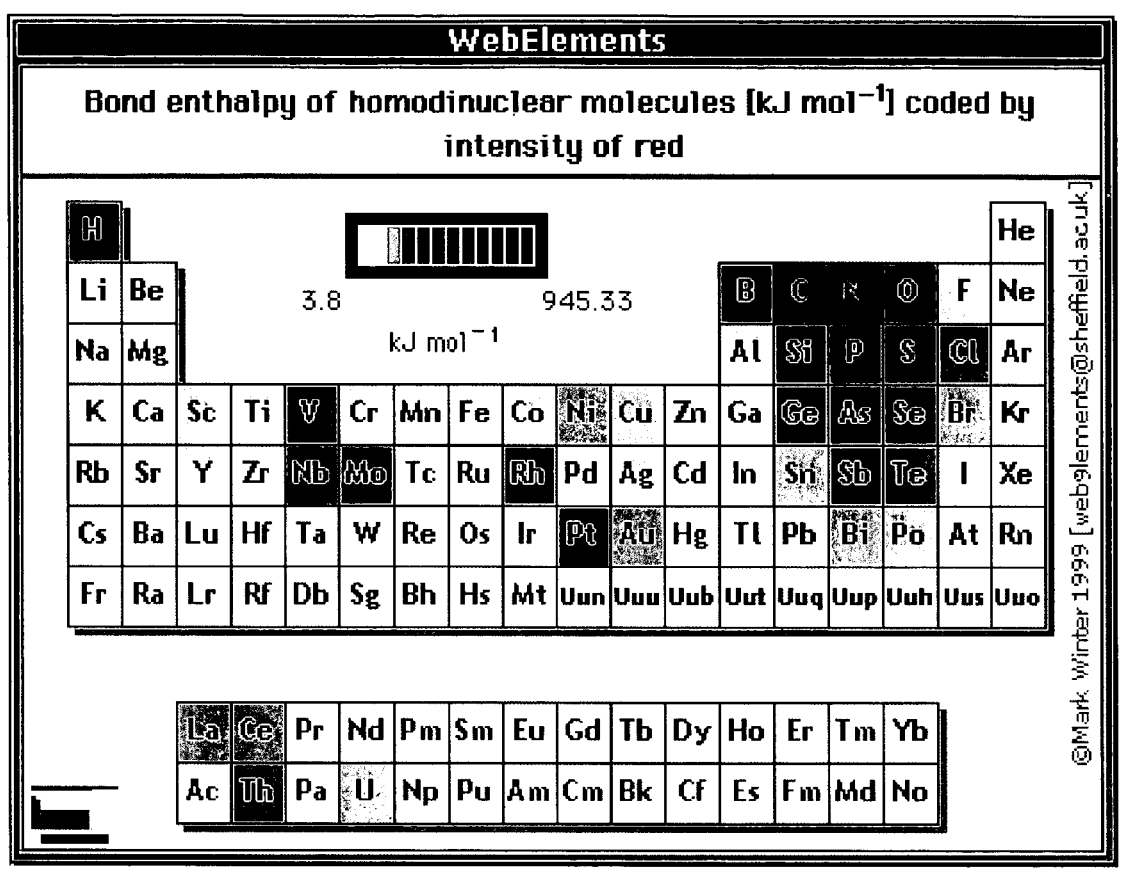
FIG. 28 shows the bond enthalpy of the homodinuclear molecules (kJ/mol)

At this point, it should be realized with the periodic table itself that arsine, stibine and bismuthine are progressively easier to decompose than phosphine. FIG. 28 shows the progressive reduction of the bond enthalpy of the homodinuclear molecules (kJ/mol) formed from the metal atoms of Group 15 of the periodic table as the Period increases from Period 3 (phosphorus) to Period 4 (arsenic) to Period 5 (antimony) and to period 6 (bismuth). The stability of the metal hydrides associated to these elements will also gradually degrade as the Period increases. This is shown by the standard Gibbs energy of formation (kJ/mol) of FIG. 29 taken from the reference: Chemistry 3810 "The Chemistry of the Main Group Elements—Hydrogen and a Survey of the Molecular Hydrides—Stability of Hydrogen Compounds", a course given in Fall 2001 by Chemistry department of The University of Lethbridge.

FIG. 29 clearly shows that it is gradually easier to decompose the hydrides formed by the Group 15 elements as the Period is increased; i.e. bismuthine is easier to decompose then stibine which is easier to decompose then arsine which is easier to decompose then phosphine which readily decompose at a deposition temperature of 550° C. with a very efficient phosphorus incorporation of about 77% into the amorphous silicon. In fact, it is shown in the following reference that stibine and bismuthine already decompose at or below room temperature, producing their respective metal and molecular hydrogen: Gábor Balázs, Hans Joachim Breunig, and Enno Lork, "Synthesis and Characterization of R$_2$SbH, R$_2$BiH, and R$_2$Bi—BiR$_2$ [R=(Me$_3$Si)$_2$CH]", Organometallics 2002, 21, 2584-2586

This excessive thermal instability of stibine and bismuthine indicate that arsine is probably the most suitable candidate to be used for an efficient and manufacturable process to achieve an in-situ N-type doped compressive mechanical stress amorphous silicon allowing, either:

The fabrication of a low surface roughness, low stress and low stress gradient conductive laminated structure composed of arsenic-doped compressive stress electrically conductive amorphous silicon layers and phosphorus-doped tensile stress electrically conductive amorphous silicon layers without the need for subsequent post-deposition high-temperature diffusions and/or activations, or more importantly;

The fabrication of a low surface roughness, low stress and low stress gradient conductive homogeneous structure using an arsenic-doped and phosphorus-doped homogeneous electrically conductive amorphous silicon without the need for subsequent post-deposition high-temperature diffusions and/or activations.

Figure 22:
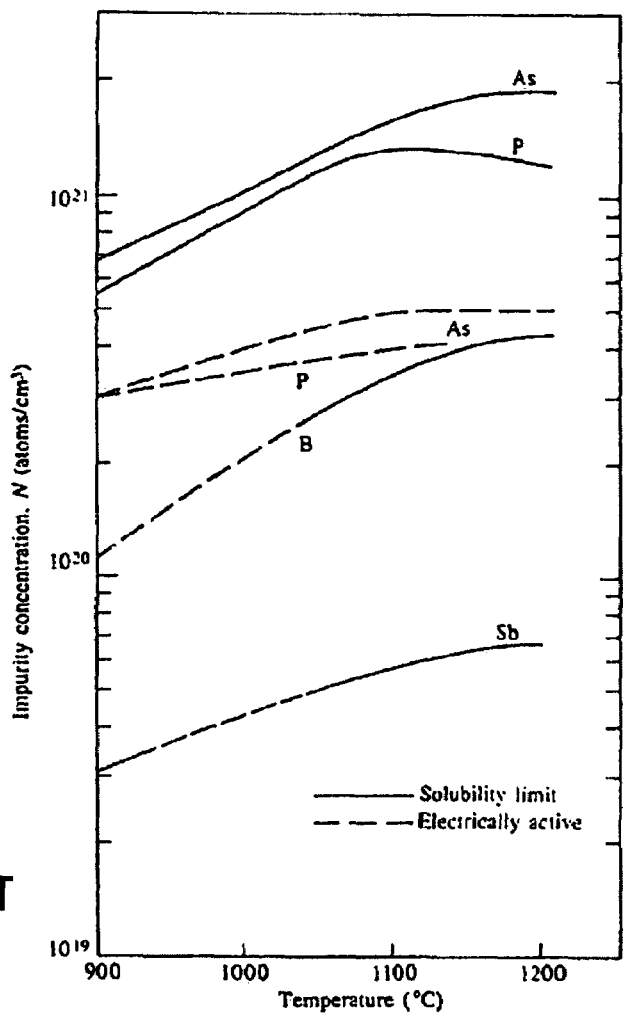
FIG. 22 shows the phosphorus, boron, and arsenic solubility limits in silicon as function of temperature.
Figure 24:
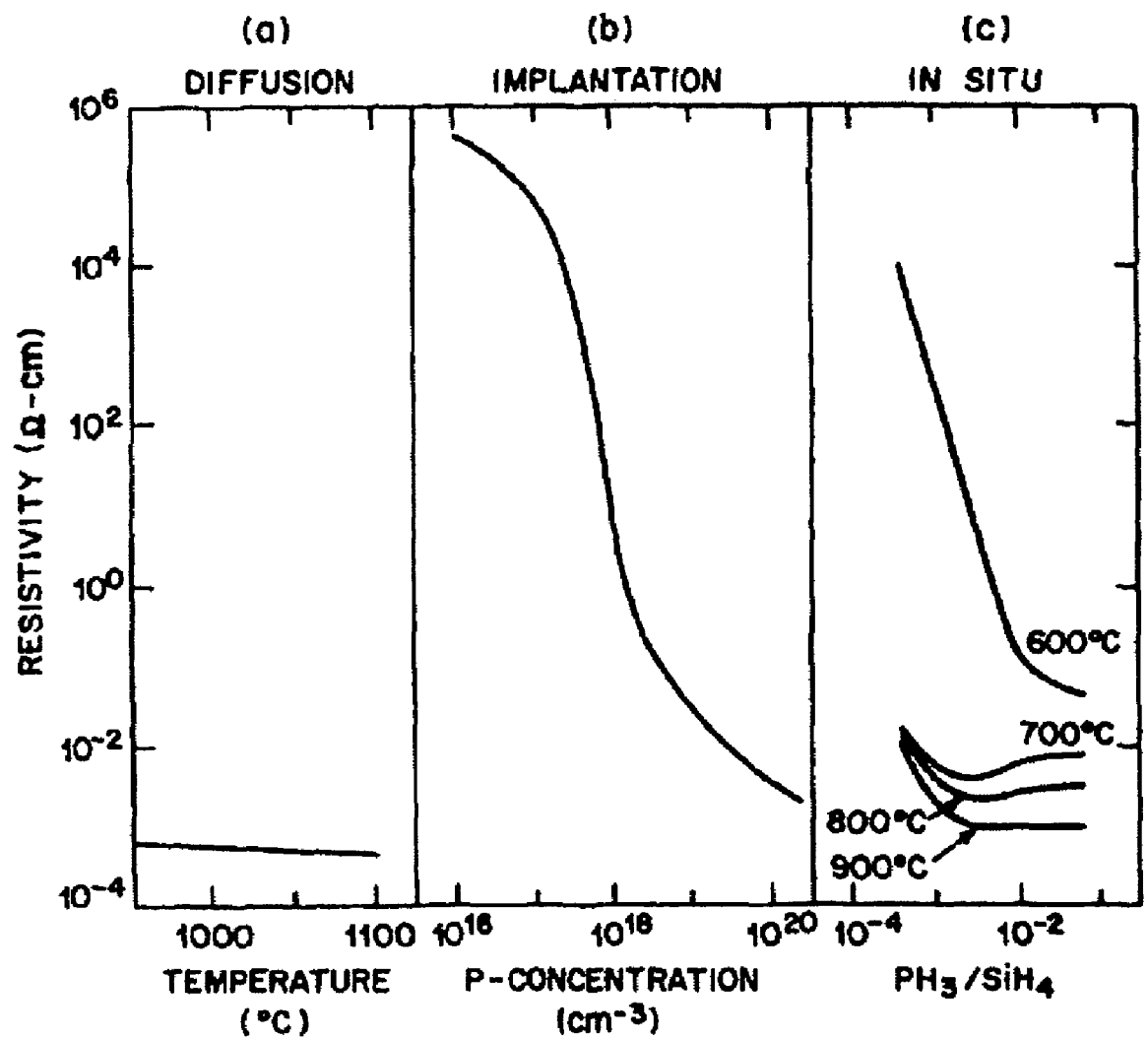
FIG. 24 is a comparison of the bulk resistivity achieved using high-temperature phosphorus diffusion, phosphorus implantation and (typical) in-situ phosphorus-doped polysilicon.

It has been shown above that:

Most phosphorus atoms released at the silicon surface are actually incorporated in the depositing silicon film at a deposition temperature of 550° C., i.e. that the atomic phosphorus does not have a too high vapour pressure at 550° C. and that its "residence time" onto the surface allows its efficient incorporation into the growing silicon surface at 550° C.:

P(at Si surface)→P(into the Si volume);

A fixed phosphorus incorporation is observed above a certain minimum mass flow rate of phosphine over which the excess phosphorus must escape from the surface i.e. the phosphorus-doped silicon has achieved the so-called phosphorus solubility limit at 550° C.:

P(at Si surface)→P(into the Si volume)+P(escape from Si surface);

An even lower minimum bulk resistivity of 0.7 mohm.cm associated with an even higher carriers concentration of about $1.5 \times 10^{20}/cm^3$ and with an even higher phosphorus incorporation is observed above a certain phosphine mass flow rate at an even lower deposition temperature of 530° C.;

To the lowest ever reported phosphorus-doped epitaxial silicon bulk resistivity of about 10 mohm.cm is associated a doping level of about $5 \times 10^{18}/cm^3$ (FIG. 21) well below the phosphorus solubility limit of about $10^{21}/cm^3$ associated with such typical silicon epitaxy temperatures of 900 to 1200° C. using phosphine as phosphorus dopant source (FIG. 22 & FIG. 23) indicating that the phosphorus atoms resulting from the complete thermal decomposition of phosphine at such high temperatures of 900 to 1200° C. ARE NOT well incorporated because phosphorus atoms have a too high vapour pressure at such high temperatures and their "residence time" onto the growing surface prevents their incorporation into the growing amorphous silicon; i.e. the phosphorus-doped epitaxial silicon cannot achieved the so-called phosphorus solubility limit at 900° C. to 1200° C. due to:

(at Si surface)→P(into the Si volume)+P(escape from Si surface)

and that most cited Prior Art techniques based on the use of phosphorus-doped epitaxial silicon still require an extra doping using a solid source (phosphosilicate glass) or low vapour pressure phosphorus source (POCl3) to achieve, at much higher diffusion temperatures of 1000° C. to 1100° C. the same low bulk resistivity of about 1 mohm.cm achieved by our disclosed technique involving phosphorus-doped amorphous silicon at a much lower deposition temperature of 550° C. allowing a much better phosphorus incorporation efficiency due to a much lower vapour pressure and a much better residence time onto the growing surface (FIG. 24).

Figure 30:
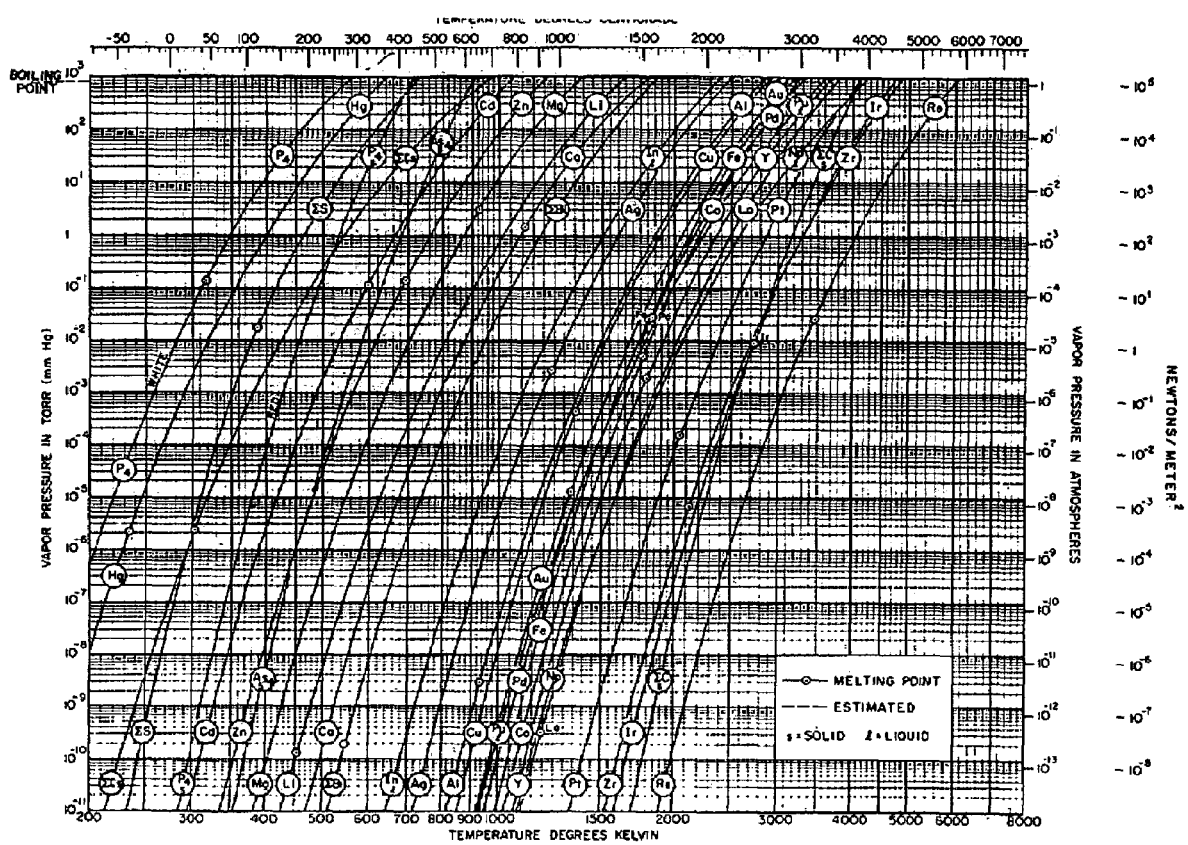
FIG. 30 shows the vapor pressure of the elements.

It is clear that the lower vapour pressure of phosphorus associated with the lower deposition temperature of 550° C. allows a better phosphorus incorporation into the growing amorphous silicon; i.e. a higher doping level and a lower bulk resistivity. The vapour pressure of the elements as function of temperature shown in FIG. 30 indicate that white phosphorus, the crystalline form involving four phosphorus atoms, and red phosphorus, the amorphous polymeric form, both have a very high vapour pressure of more than about $10^4$ Torr (about 1 MPa) at a deposition temperature of 550° C.; and arsenic has a much lower vapour pressure of about $10^2$ Torr (about 10 kPa) at the same deposition temperature of 550° C.

This lower vapour pressure of arsenic indicates that the incorporation rate of arsenic should be even easier then the incorporation rate of phosphorus at the same amorphous silicon deposition temperature of 550° C. and that it would be possible to achieve an even larger doping level and an even lower bulk resistivity than the observed and disclosed 1 mohm.cm bulk resistivity obtained with phosphorus doping at the deposition temperature of 550° C. To this lower vapour pressure of arsenic is associated a longer "residence time" on the growing surface and a higher incorporation rate; i.e. higher solubility limit.

Figure 23:
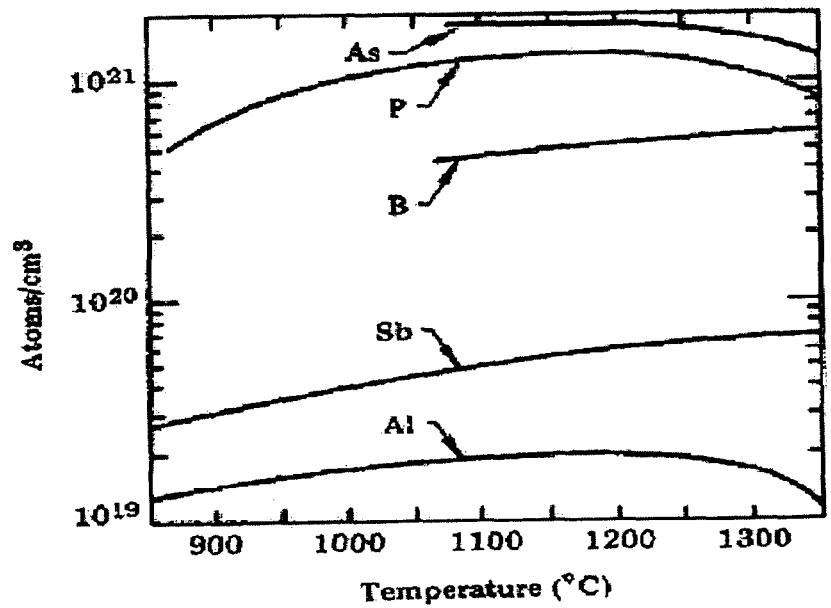
FIG. 23 shows the phosphorus, boron, arsenic, antimony, and aluminum solubility limits in silicon as function of temperature
Figure 31:
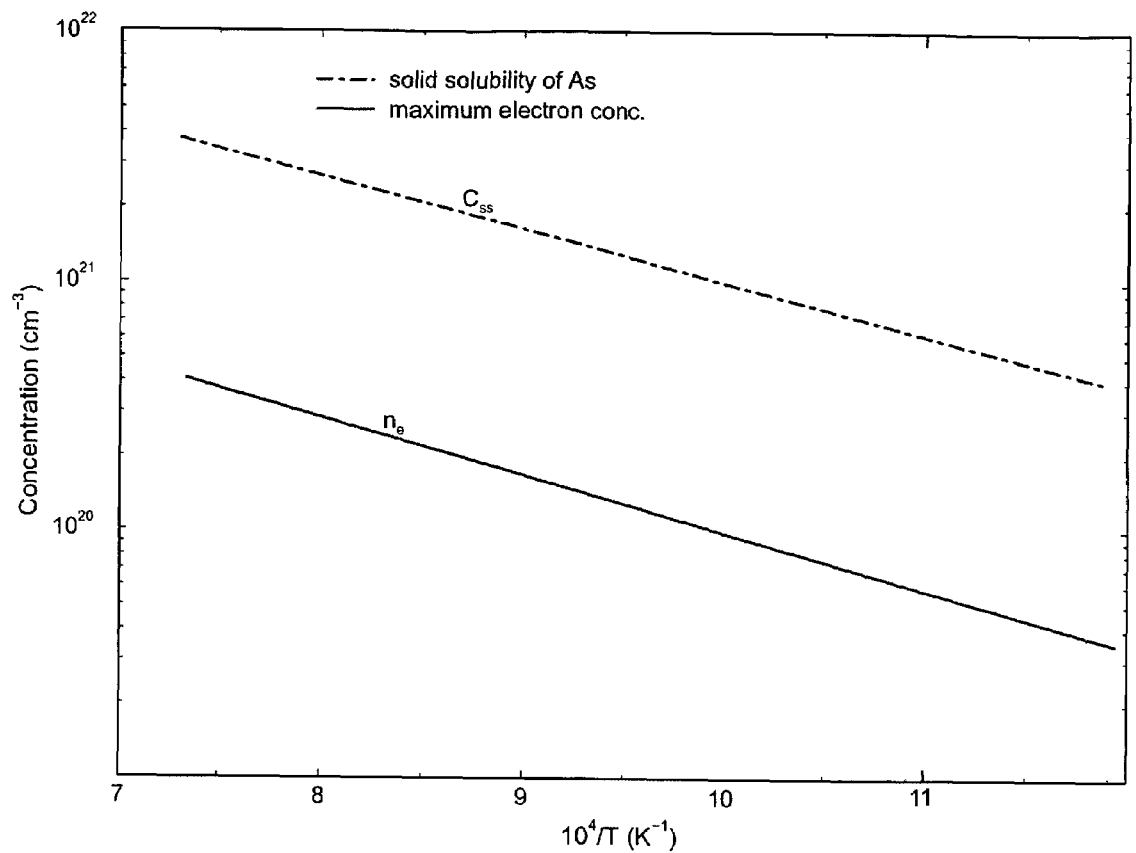
FIG. 31 shows the solubility limit of arsenic in silicon as function of temperature.

The solubility limit of arsenic in silicon is shown to be effectively higher than phosphorus in the range of about $7 \times 10^{20}/cm^3$ at 900° C. to $2 \times 10^{21}/cm^3$ at 1200° C. in one previously cited reference (FIG. 22) and in the range of about $1.5 \times 10^{21}/cm^3$ at 1050° C. to $1.2 \times 10^{21}/cm^3$ at 1350° C. in another previously cited reference (FIG. 23). These temperatures are much higher then our deposition temperature of 550° C. resulting in an amorphous silicon. FIG. 31 is derived from a third reference, Pavel Fastenko, "Modeling and Simulation of Arsenic Activation and Diffusion in Silicon", Ph. D. thesis, Electrical Engineering, University of Washington, 2002, p. 55, down to a temperature of about 550° C. ($10^4$/T=12). FIG. 31 shows that the arsenic solubility limit at a temperature of about 550° C. is extrapolated ($1.3 \times 10^{23}$ exp (−0.42/kT) $cm^{-3}$) at about $3.7 \times 10^{20}/cm^3$ while the carrier concentration ($2.2 \times 10^{22}$ exp (−0.47/kT) $cm^{-3}$) resulting from an arsenic dopant activation of less then about 10% is extrapolated one decade lower at about $3.4 \times 10^{19}/cm^3$. According to FIG. 21, such arsenic doping levels should result in a bulk resistivity of the order of 2 mohm.cm, again much better than the best ever reported bulk resistivity of epitaxial silicon.

Figure 19:
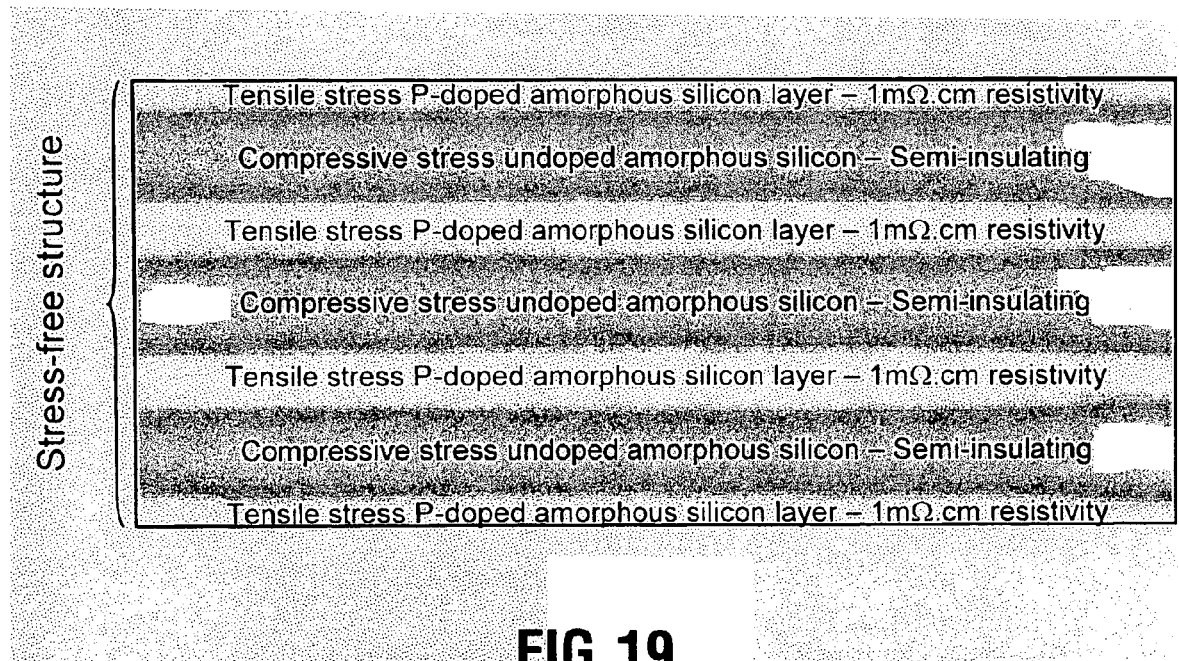
FIG. 19 shows a stress-free laminated structure made from un-doped and phosphorus-doped amorphous silicon.

The laminated combination of compressive mechanical stress arsenic-doped electrically amorphous silicon with tensile mechanical stress phosphorus-doped electrically conductive amorphous silicon allows the structure of FIG. 19 (capable of planar electrical conductance in the plane of the substrate) to be replaced by the structure of FIG. 26. Replacing the undesirable semi-insulating un-doped amorphous silicon layers of FIG. 19 by the very conductive arsenic-doped amorphous silicon layers and allowing of FIG. 26 allows the elimination of the vertical isolation between the conductive phosphorus-doped amorphous silicon layers and allow an efficient conductance normal to the plane of these layers.

More importantly, the replacement of this improved conductance laminated structure of FIG. 26 by the homogeneous structure of FIG. 27 allows a simplification of the structure by eliminating the need for switching arsine and phosphine gases during the deposition and allow a more forgiving process to achieve low stress gradient structures.

Figure 1:
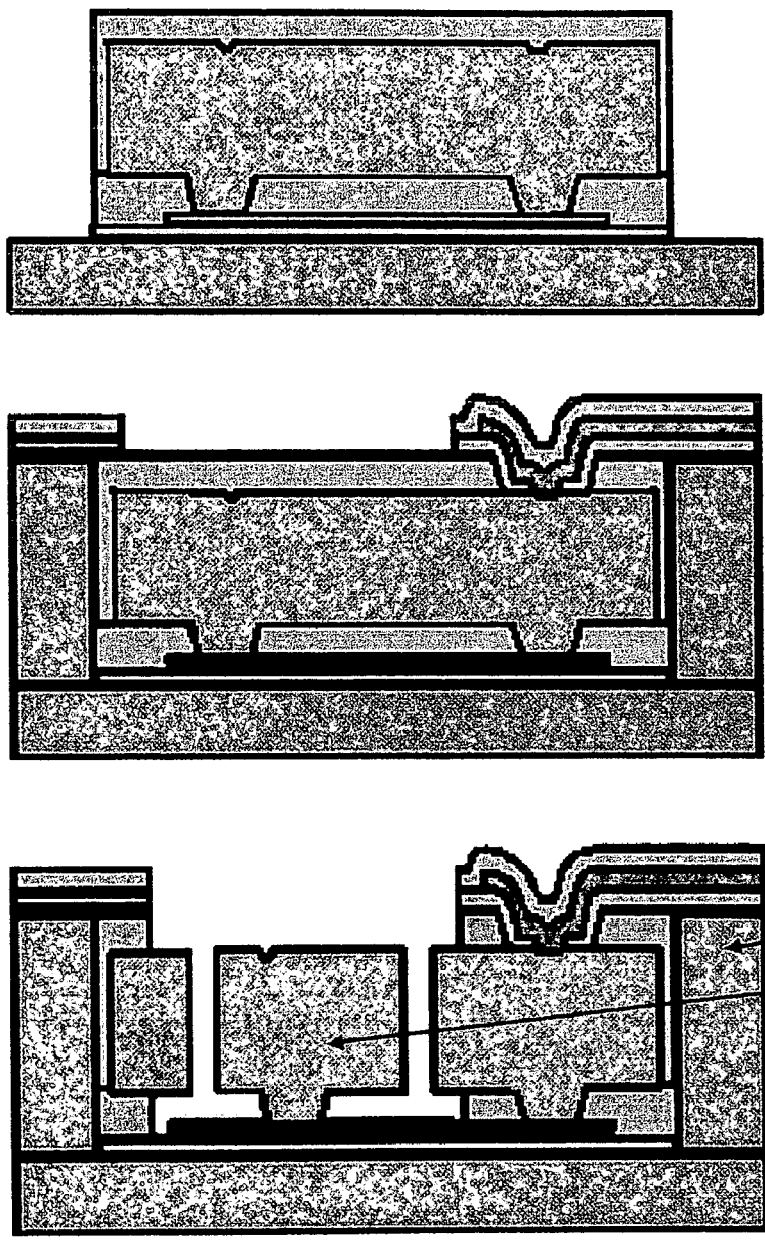
FIG. 1 shows Analog Devices' Modular MEMS process.
Figure 2:
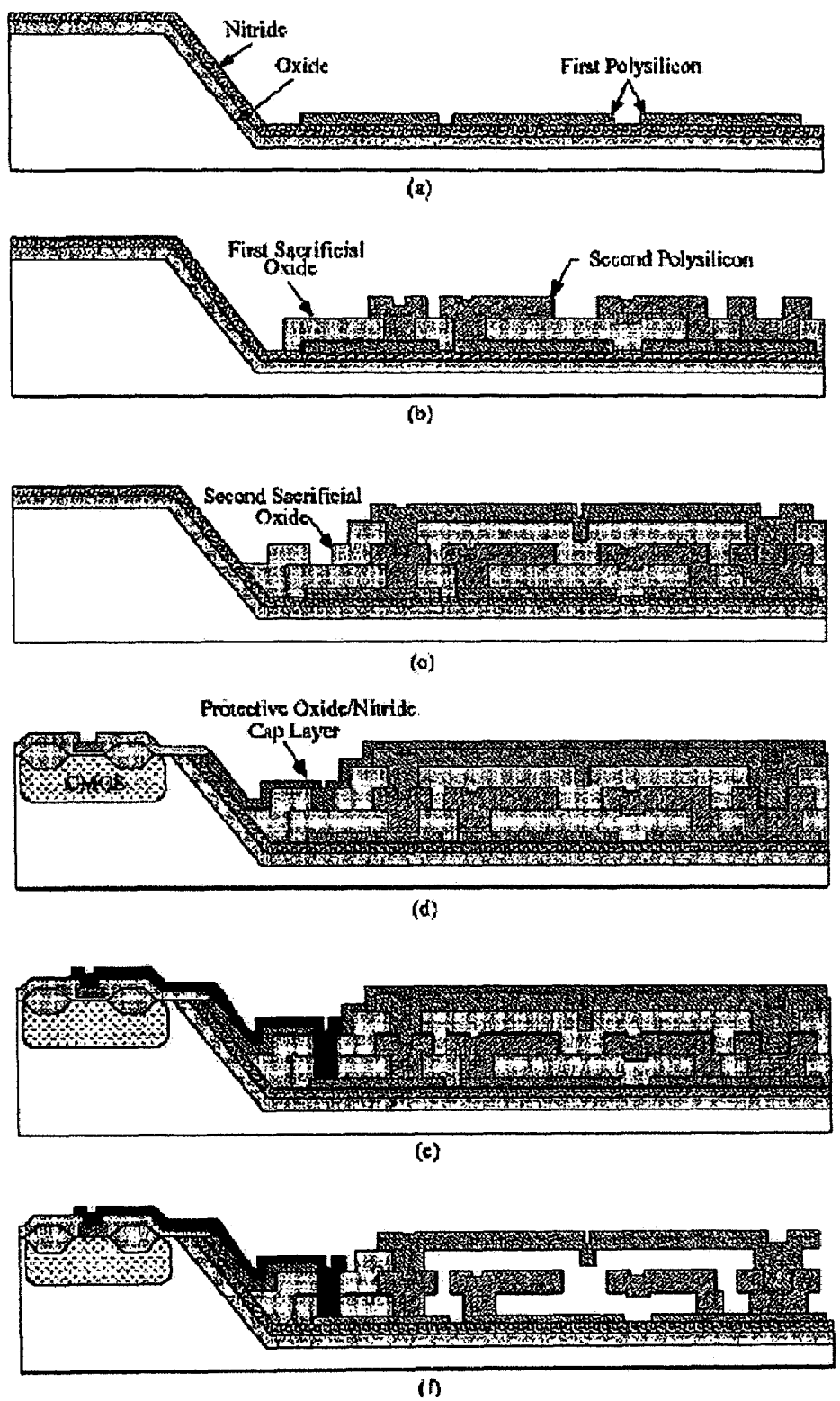
FIG. 2 shows SAIT's MEMS process.
Figure 3:
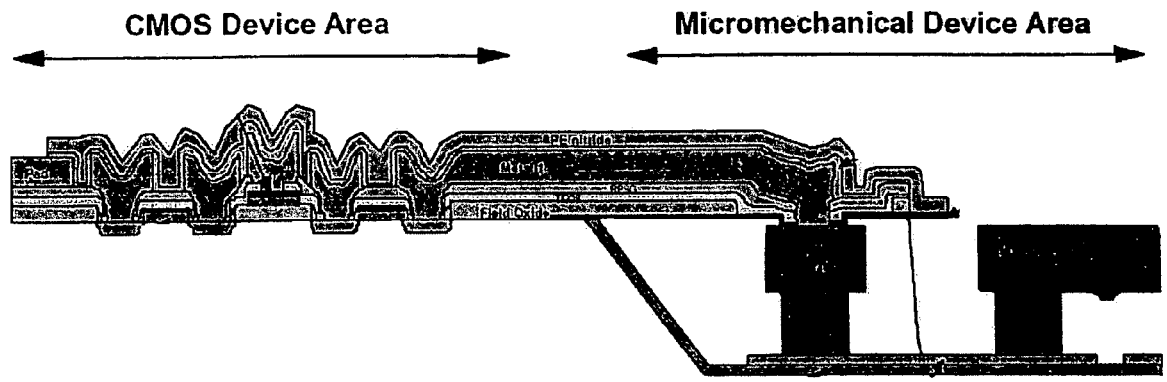
FIG. 3 shows Sandia's IMEMS process.
Figure 4:
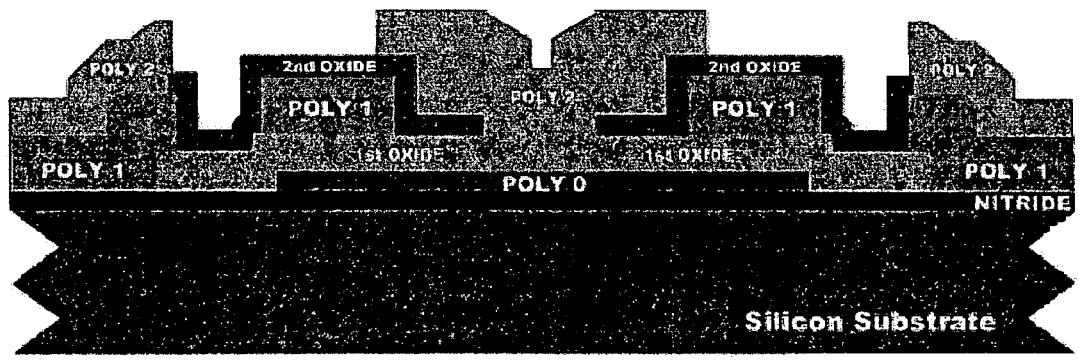
FIG. 4 shows MEMSCAP's MUMPs process.
Figure 5:
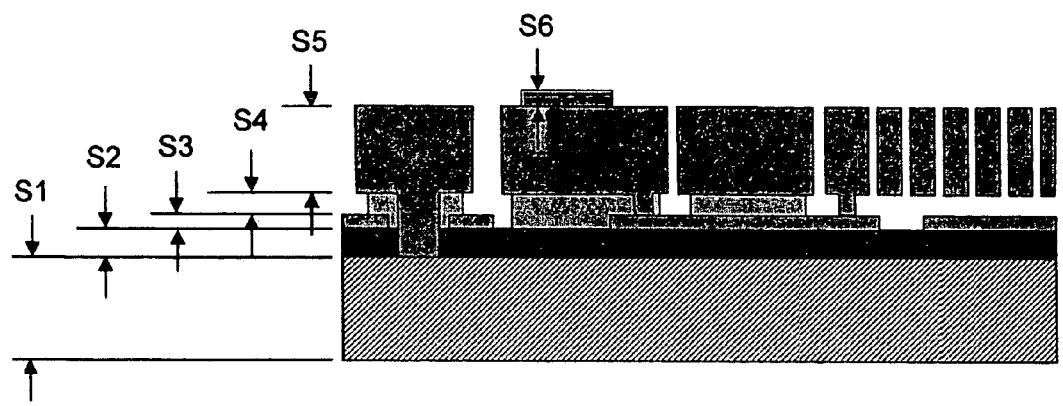
FIG. 5 shows Robert Bosch's surface micromachining process.
Figure 6:
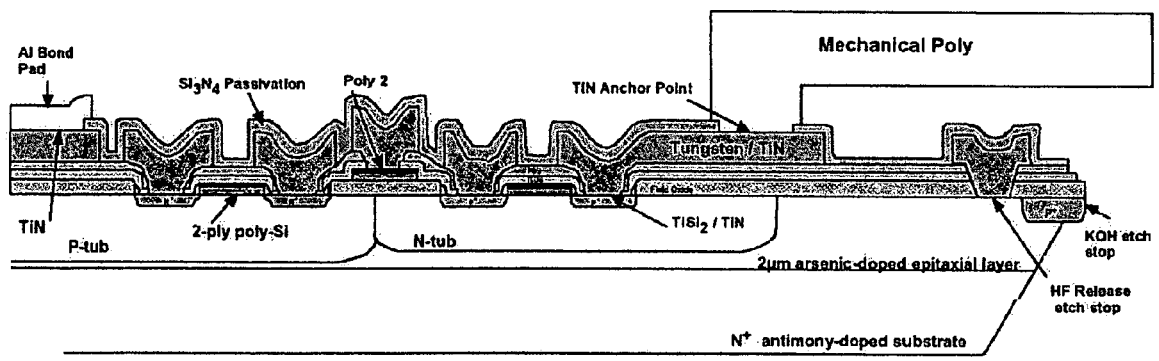
FIG. 6 shows Sandia's CMOS-first, micromechanics-last MEMS process.
Figure 8:
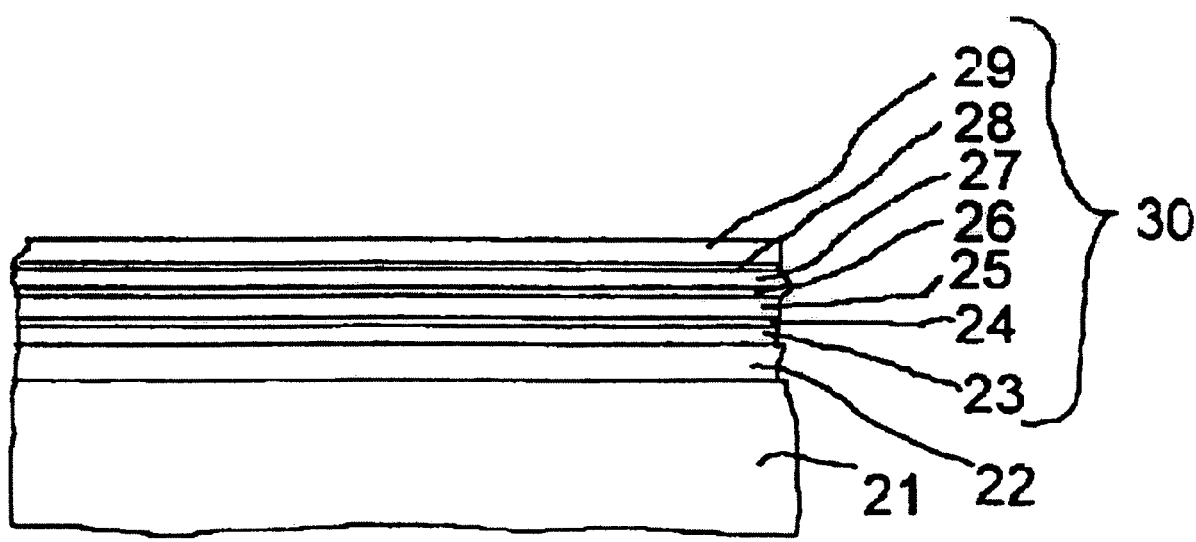
FIG. 8 shows Siemens Aktiengesellschaft's low-stress laminated silicon structure.
Figure 10:
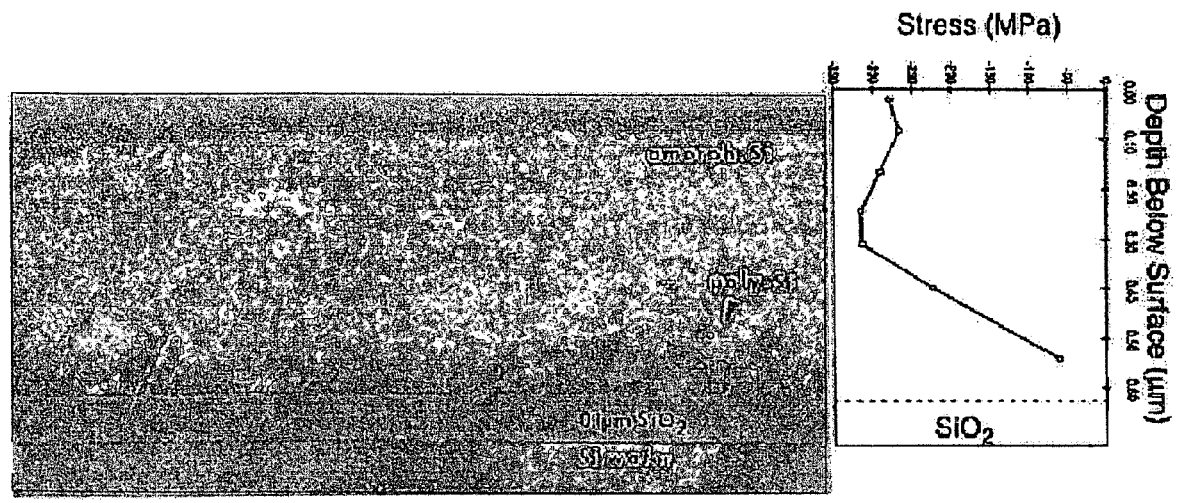
FIG. 10 shows UC Berkeley's low-stress re-crystallized in-situ doped polysilicon.
Figure 11:
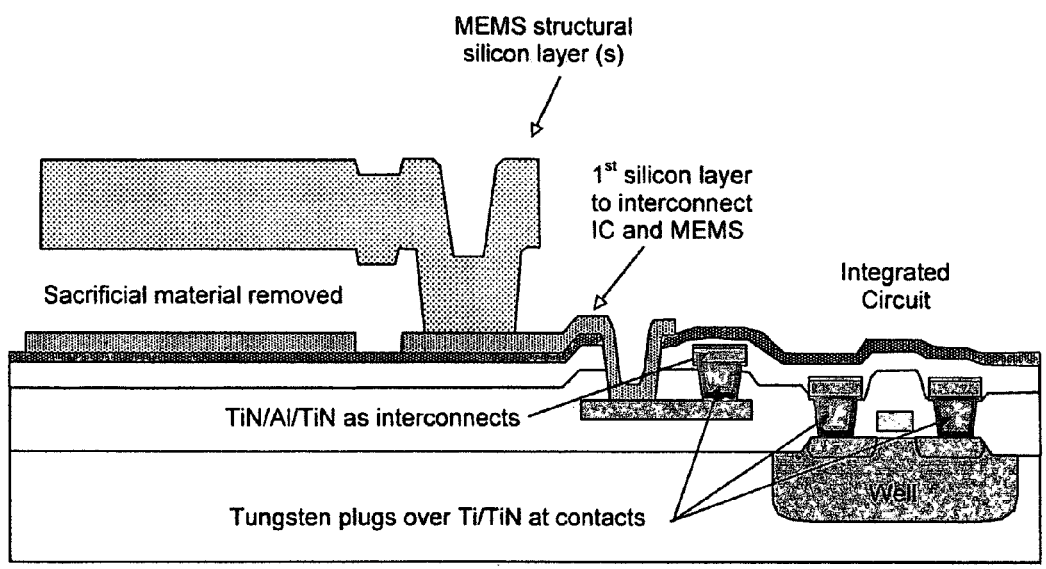
FIG. 11 illustrates a strategy allowing the fabrication of advanced MEMS after the integrated circuit.
Figure 14:
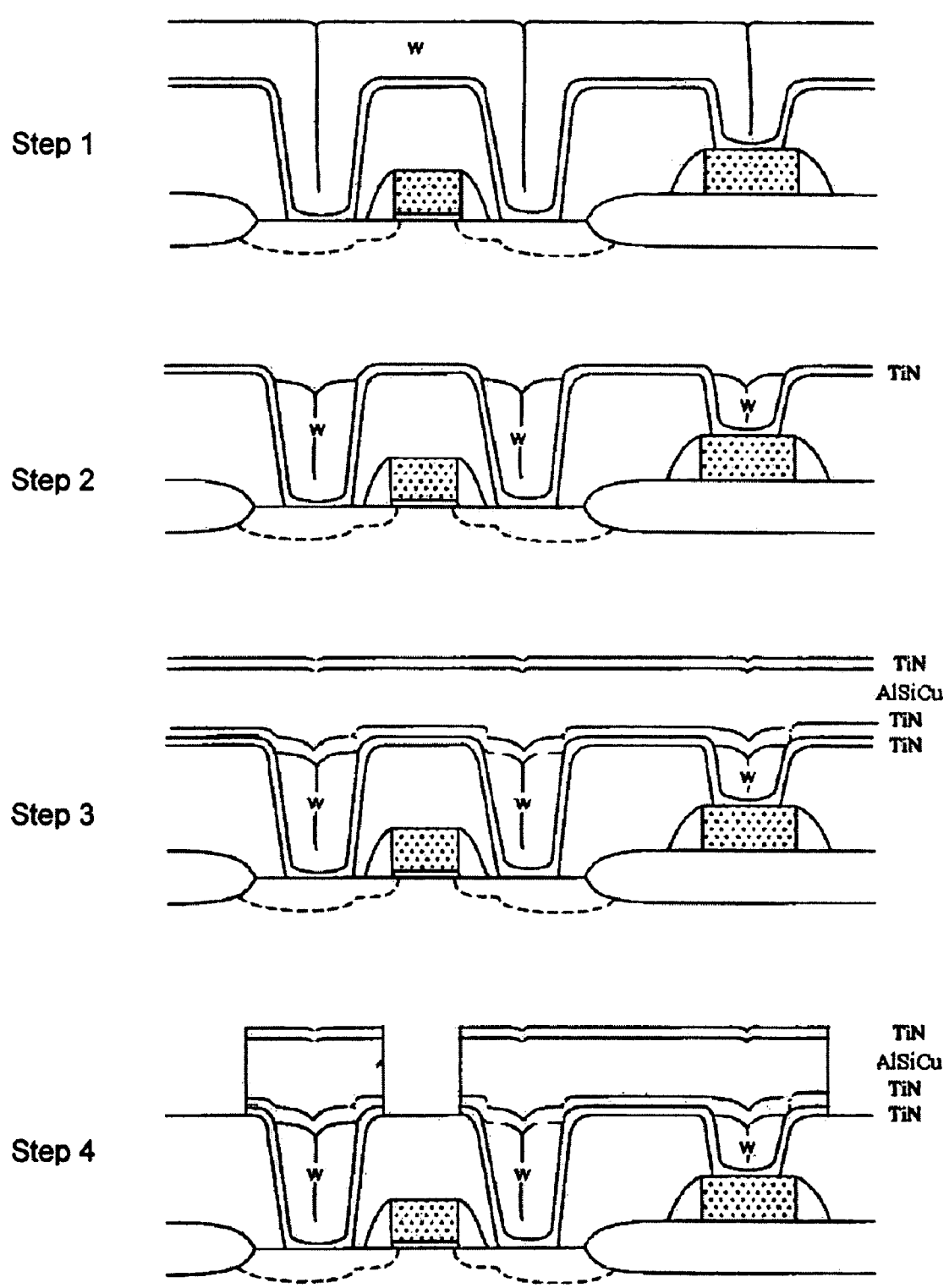
FIG. 14 shows an interconnection strategy allowing the fabrication of advanced MEMS after the integrated circuit.

The integration of modular MEMS devices directly over a previously fabricated integrated circuit is now even more flexible with these low surface roughness, low stress, low stress gradient and low resistivity laminated arsenic-doped and phosphorus-doped structures or, more importantly, with these low surface roughness, low stress, low stress gradient and low resistivity homogeneous arsenic-doped and phosphorus-doped structures because in both cases the maximum exposure temperature of 550° C. is now compatible with tungsten-filled contacts and its underlying high quality titanium nitride barrier/glue layer (FIG. 11, FIG. 12 and FIG. 14). More, the integration of these modular MEMS devices over an integrated circuit benefit from the smooth surface topology profile resulting from these amorphous silicon layers and eliminate the complex processing related to the alternate approach requiring extensive planarization of the thick structures composing the MEMS devices as to allow precision photolithography to be performed with modern exposure equipment having small depth of focus.

We claim:

1. In a method of fabricating a silicon-based microstructure, the improvement comprising: depositing electrically conductive amorphous silicon doped in situ with first and second dopants, said first dopant being selected from the group consisting of arsenic, antimony, and bismuth; and said second dopant being phosphorus, and wherein said structure is a laminated structure with alternating first and second layers, each said first layer being doped with said first dopant and being in compressive mechanical stress and each said second layer being doped with said second dopant and being in tensile mechanical stress, and wherein said structure has a residual mechanical stress of less than +/−100 Mpa and a stress gradient of less than +/−20 Mpa/μm.

2. The method of claim 1, wherein said first layer has a compressive stress of −0.01 to −400 Mpa, and said second layer has a tensile stress of+0.01 to+400 Mpa.

3. The method of claim 2, wherein said first dopant is arsenic and said first layer is deposited in-situ at a temperature of 520 to 580° C. from a silane partial pressure of 100 to 5000 mTorr and from an arsine pressure of 0.01 to 50.0 mTorr to achieve a bulk resistivity of 0.01 to 1000 mohm.cm.

4. The method of claim 3, wherein said second layer is deposited at a temperature of 520 to 580° C. from a silane partial pressure of 100 to 5000 mTorr and from a phosphine partial pressure of 0.1 to 5.0 mTorr.

5. The method of claim 2, wherein said first dopant is antimony and said first layer is deposited in-situ at a temperature of 520 to 580° C. from a silane partial pressure of 100 to 5000 mTorr and from a stibine pressure of 0.01 to 50.0 mTorr to achieve a bulk resistivity of 0.01 to 1000 mohm.cm.

6. The method of claim 5, wherein said second layer is deposited at a temperature of 520 to 580° C. from a silane partial pressure of 100 to 5000 mTorr and from a phosphine partial pressure of 0.1 to 5.0 mTorr.

7. The method of claim 2, wherein said first dopant is bismuth and said first layer is deposited in-situ at a temperature of 520 to 580° C. from a silane partial pressure of 100 to 5000 mTorr and from an arsine pressure of 0.01 to 50.0 mTorr to achieve a bulk resistivity of 0.01 to 1000 mohm.cm.

8. The method of claim 7, wherein said second layer is deposited at a temperature of 520 to 580° C. from a silane partial pressure of 100 to 5000 mTorr and from a phosphine partial pressure of 0.1 to 5.0 mTorr.

9. The method of claim 1, wherein an integrated circuit is fabricated prior to depositing said electrically conductive amorphous silicon; and after fabricating said integrated circuit, a MEMS structure is integrated with said integrated circuit by carrying out said depositing of electrically conductive amorphous silicon.

10. The method of claim 9 wherein said amorphous silicon is deposited in-situ at a temperature of 520 to 580° C. from a silane partial pressure of 100 to 5000 mTorr, from a partial pressure of said first dopant 0.01 to 50.0 mTorr, and from a partial pressure of said second dopant of 0.1 to 5.0 mTorr.

11. In a method of fabricating a silicon-based microstructure, the improvement comprising: depositing electrically conductive amorphous silicon while simultaneously doping said amorphous silicon in situ with first and second dopants to produce a homogenous structure having a residual mechanical stress of less than +/=100Mpa and bulk resistivity of 0.01 to 1000 mohm.cms , said first dopant being selected from the group consisting of arsenic, antimony, and bismuth; and said second dopant being phosphorus.

12. The method of claim 11, wherein said first dopant is arsenic and said amorphous silicon is deposited in-situ at a temperature of 520 to 580° C. from a silane partial pressure of 100 to 5000 mTorr, from an arsine pressure of 0.01 to 50.0 mTorr, and from a phosphine partial pressure of 0.1 to 5.0 mTorr.

13. The method of claim 11, wherein said first dopant is antimony and said amorphous silicon is deposited in-situ at a temperature of 520 to 580° C. from a silane partial pressure of 100 to 5000 mTorr, from a stibine partial pressure of 0.01 to 50.0 mTorr, and from a phosphine partial pressure of 0.1 to 5.0 mTorr.

14. The method of claim 11, wherein said first dopant is bismuth and said amorphous silicon is deposited in-situ at a temperature of 520 to 580° C. from a silane partial pressure of 100 to 5000 mTorr, from an bismuthine pressure of 0.01 to 50.0 mTorr, and from a phosphine partial pressure of 0.1 to 5.0 mTorr.

15. The method of claim 11, wherein an integrated circuit is fabricated prior to depositing said electrically conductive amorphous silicon; and after fabricating said integrated circuit, a MEMS structure is integrated with said integrated circuit by carrying out said depositing of electrically conductive amorphous silicon.

16. The method of claim 15, wherein said amorphous silicon is deposited in-situ at a temperature of 520 to 580° C. from a silane partial pressure of 100 to 5000 mTorr, from a partial pressure of said first dopant 0.01 to 50.0 mTorr, and from a partial pressure of said second dopant of 0.1 to 5.0 mTorr.

* * * * *